(12) United States Patent
Bhattacharyya

(10) Patent No.: US 6,768,156 B1
(45) Date of Patent: Jul. 27, 2004

(54) NON-VOLATILE RANDOM ACCESS MEMORY CELLS ASSOCIATED WITH THIN FILM CONSTRUCTIONS

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/364,046

(22) Filed: Feb. 10, 2003

(51) Int. Cl.$^7$ .............................................. H01L 29/76
(52) U.S. Cl. ...................... 257/314; 257/315; 257/317
(58) Field of Search .............................. 257/314, 315, 257/316, 317, 318, 321

(56) References Cited

U.S. PATENT DOCUMENTS 5,825,064 A * 10/1998 Hayashi et al. ............. 257/316

OTHER PUBLICATIONS

Ono, K. et al., "Analysis of Current–Voltage Characteristics in Polysilicon TFTs for LCDs", IEDM Tech. Digest., 1998, pp. 258–259.

Yamauchi, N. et al., "Drastically Improved Performance In Poly–Si TFTs with Channel Dimensions Comparable to Grain Size", IEDM Tech. Digest, 1989, pp. 353–356.

King, T. et al., "A Low–Temperature ($\leq$550° C.) Silicon–Temperature MOS Thin–Film Transistor Technology for Large–Area Electronics", IEDM Tech. Digest, 1991, pp. 567–570.

Kuriyama, H. et al., "High Mobility Poly–Si TFT by a New Excimer Laser Annealing Method for Large Area Electronics", IEDM Tech. Digest, 1991, pp. 563–566.

Jeon, J. et al., "A New Poly–Si TFT with Selectivity Doped Channel Fabricated by Novel Excimer Laser Annealing", IEDM Tech. Digest, 2000, pp. 213–216.

Kim, C.H. et al., "A New High –Performance Poly–Si TFT by Simple Excimer Annealing on Selectivity Floating a–Si Layer", IEDM Tech. Digest, 2001, pp. 751–754.

Hara, A. et al, "Selective Single–Crystalline–Silicon Growth at the Pre–Defined Active Regions of TFTs on a Glass by a Scanning CW Layer Irradiation", IEDM Tech. Digest, 2000, pp. 209–212.

Hara, A. et al., "High Performance Poly–Si TFTs on a Glass by a Stable Scanning CW Laser Lateral Crystallization", IEDM Tech. Digest, 2001, pp. 747–750.

Jagar, S. et al., "Single Grain Thin–Film–Transistor (TFT) with SOI CMOS Performance Formed by Metal–Induced–Lateral–Crystallization", IEDM Tech. Digest, 1999, p. 293–296.

Gu, J. et al., "High Performance Sub–100 nm Si Thin–Film Transistors by Pattern–Controlled Crystallization of Thin Channel Layer and High Temperature Annealing", DRC Conference Digest, 2002, pp. 49–50.

(List continued on next page.)

*Primary Examiner*—Long Pham
*Assistant Examiner*—Hoai Pham
(74) *Attorney, Agent, or Firm*—Wells St. John P.S.

(57) ABSTRACT

The invention pertains to thin film constructions comprising NVRAM devices built over a versatile substrate base. In particular aspects, a device includes a body region, and further include first and second diffusion regions formed in the body region. A channel region is in the body region between the first and second diffusion regions. A gate insulator stack is above the channel region, and a gate is over the gate insulator stack. The gate insulator stack includes a floating plate charge center which is electrically connected to the second diffusion region. The memory device includes a diode which connects the body region to the second diffusion region such that the floating plate is charged when the diode is reversed biased. The invention also includes electronic systems comprising novel TFT-based NVRAM devices.

69 Claims, 15 Drawing Sheets

OTHER PUBLICATIONS

Kasan, V. et al., "High Performance 0.25μm p–MOSFETs with Silicon– Germanium Channels for 300K and 77K Operation", IEDM Tech. Digest, 1991, pp. 25–28.

Garone, P.M. et al., "Mobility Enhancement and Quantum Mechanical Modeling in $Ge_2Si_1$, Channel MOSFETs from 90 to 300K", IEDM Tech. Digest, 1991, pp. 29–32.

Feder, B.J., "I.B.M. Finds Way to Speed Up Chips", The New York Times, Jun. 8, 2001, reprinted from http://www.nytimes.com/2001/08/18 /technology/08BLUE.html, 2 pgs.

Rim, K. et al., "Strained Si MOSFET's for High Performance CMOS Technology", 2001 Sympos. on VLSI Tech. Digest of Technical Papers, p. 59–60.

Li, P. et al., "Design of High Speed Si/Se/Ge Heterojunction Complementary MOSFETs with Reduced Short–Channel Effects", Natl. Central University, ChungLi, Taiwan, ROC, Aug. 2001, Contract No. NSC 89–2215–E–008–049 National Science Council of Taiwan., pp. 1, 9.

Ernst, T. et al., "Fabrication of a Novel Strained SiGe:C–channel Planar 55 nm nMOSFET for High–Performance CMOS", 2002 Sympos. on VLSI Tech. Digest of Technical Papers, pp. 92–93.

Rim, K. et al., "Characteristics and Device Design of Sub–100 nm Strained SiN– and PMOSFETs", 2002 Sympos. on VLSI Tech. Digest of Technical Papers, pp. 98–99.

Belford, R.E. et al., "Performance–Augmented CMOS Using Back–End Uniaxial Strain", DRC Conf. Digest, 2002, pp. 41–42.

Shima, M. et al., "<100> Channel Strained–SiGe p–MOSFET with Enhanced Hole Mobility and Lower Parasitic Resistance", 2002 Sympos. on VLSI Tech. Digest of Technical Papers, pp. 94–95.

Nayfeh, H.M. et al., "Electron Inversion Layer Mobility in Strained–Si n–MOSFET's with High Channel Doping Concentration Achieved by Ion Implantation", DRC Conf. Digest, 2002, pp. 43–44.

Bae, G.J. et al., "A Novel SiGe–Inserted SOI Structure for High Performance PDSOI CMOSFET", IEDM Tech. Digest, 2000, pp. 667–670.

Cheng, Z. et al., "SiGe–on–Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., 10/01, pp. 13–14, 3–pg. outline.

Huang, L.J. et al., "Carrier Mobility Enhancement in Strained Si–on–Insulator Fabricated by Wafer Bonding", 2001 Sympos. on VLSI Tech. Digest of Technical Papers, pp. 57–58.

Mizuno, T. et al., "High Performance CMOS Operation of Strained–SOI MOSFETs Using Thin Film SiGe–on–Insulator Substrate", 2002 Sympos. on VLSI Tech. Digest of Technical Papers, p. 106–107.

Tazuka, T. et al., "High–Performance Strained Si–on–Insulator MOSFETs by Novel Fabrication Processes Utilizing Ge–Condensation Technique", 2002 VLSI Tech. Digest of Technical Papers, pp. 96–97.

Takagi, S., "Strained–Si– and SiGe–on–Insulator (Strained SOI and SGOI) MOSFETs for High Performance/Low Power CMOS Application", DRC Conf. Digest, 2002, pp. 37–40.

"IBM Builds World's Fastest Communications Microchip", Reuters U.S. Company News, Feb. 25, 2002, reprinted from http://activequote300.fidelity.com/rtnews/ individual n . . . / . . . , 1 pg.

Markoff, J., "I.B.M. Circuits are Faster and Reduce Use of Power". The New York Times, Feb. 25, 2002, reprinted Mar. 20, 2002 from http://story.news.yahoo.com/ news?tmpl=story&u=/nyt/20020225/ . . . , 1 pg.

Park, J.S. et al., "Normal Incident SiGe/Si Multiple Quantum Well Infrared Detector", IEDM Tech. Digest, 1991, pp. 749–752.

Current, M.I. et al., "Atomic–Layer Cleaving with $Si_2Ge_7$ Strain Layers for Fabrication of Si and Ge–Rich SOI Device Layers", 2001 IEEE Internatl. SOI Conf. 10/01, pp. 11–12.

Bhattacharyya, A., "The Role of Microelectronic Integration in Environmental Control: A Perspective", Mat. Res. Soc. Symp. Proc. vol. 344, 1994, pp. 281–293.

Myers, S.M. et al., "Deuterium Interactions in Oxygen–Implanted Copper", J. Appl. Phys., vol. 65(1), Jan. 1, 1989, p. 311–321.

Saggio, M. et al., "Innovative Localized Lifetime Control in High–Speed IGBTs", IEEE Elec. Dev. Lett., V. 18, No. 7, Jul. 1997, pp. 333–335.

Lu, N.C.C. et al., "A Buried–Trench DRAM Cell Using a Self–Aligned Epitaxy Over Trench Technology", IEDM Tech. Digest, 1988, pp. 588–591.

Yamada, T. et al., "Spread Source/Drain (SSD) MOSFET Using Selective Silicon Growth for 84Mbit DRAMs", IEDM Tech. Digest, 1989, pp. 35–38.

van Maer, H. et al., "Ultra–Thin Film Fully–Depleted SOI CMOS with Raised G/S/D Device Architecture for Sub–100 nm Applications", 2001 IEEE Internatl. SOI Conf. 10/01, pp. 45–46.

\* cited by examiner

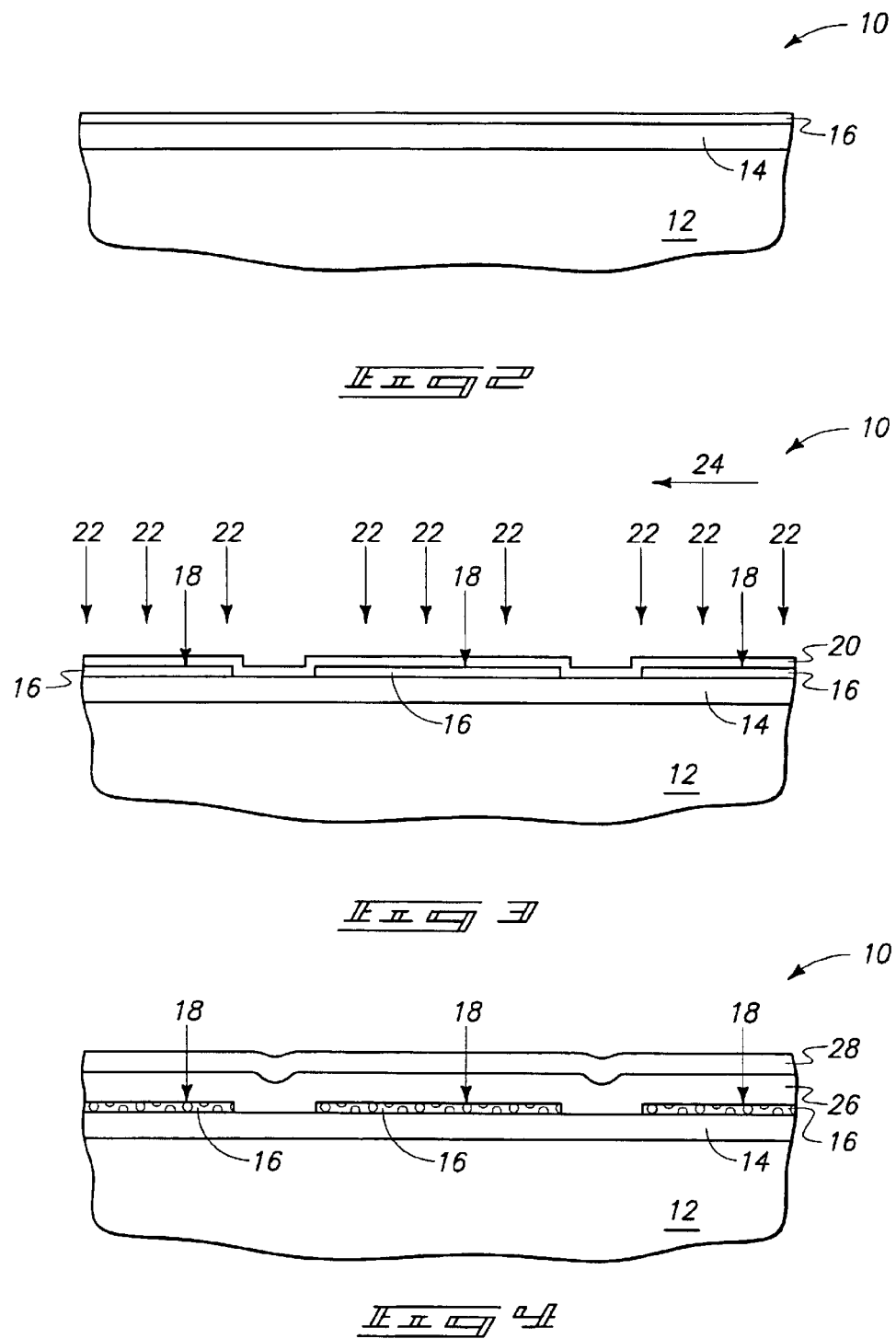

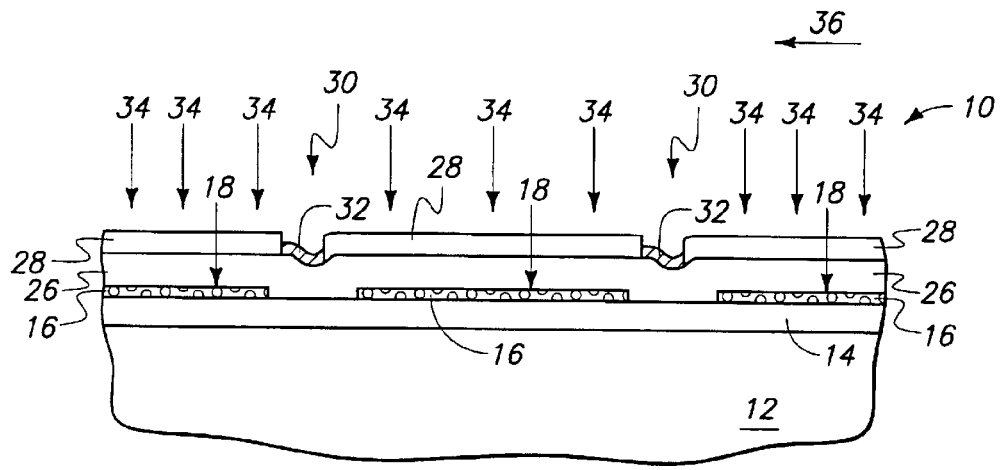
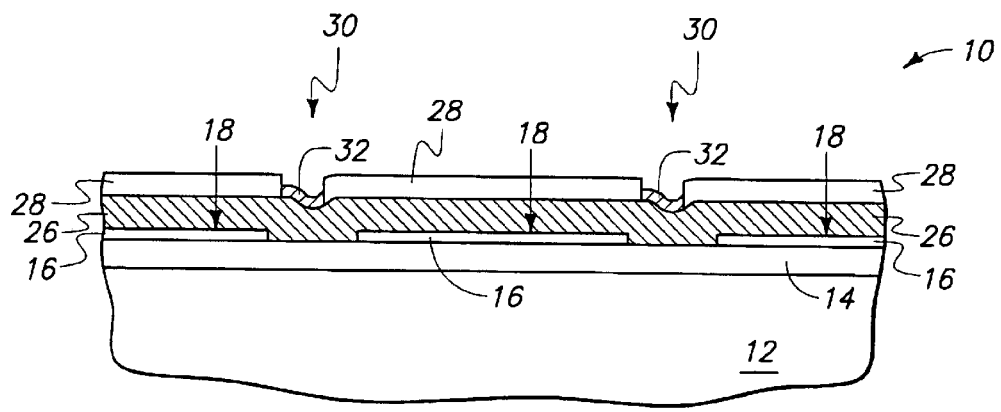
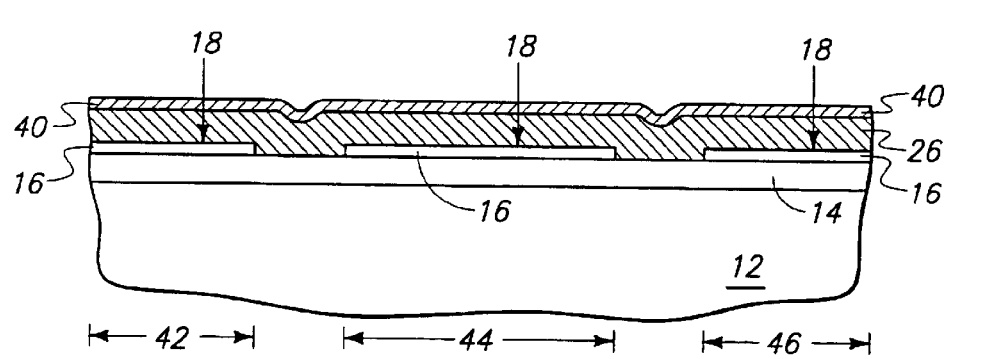

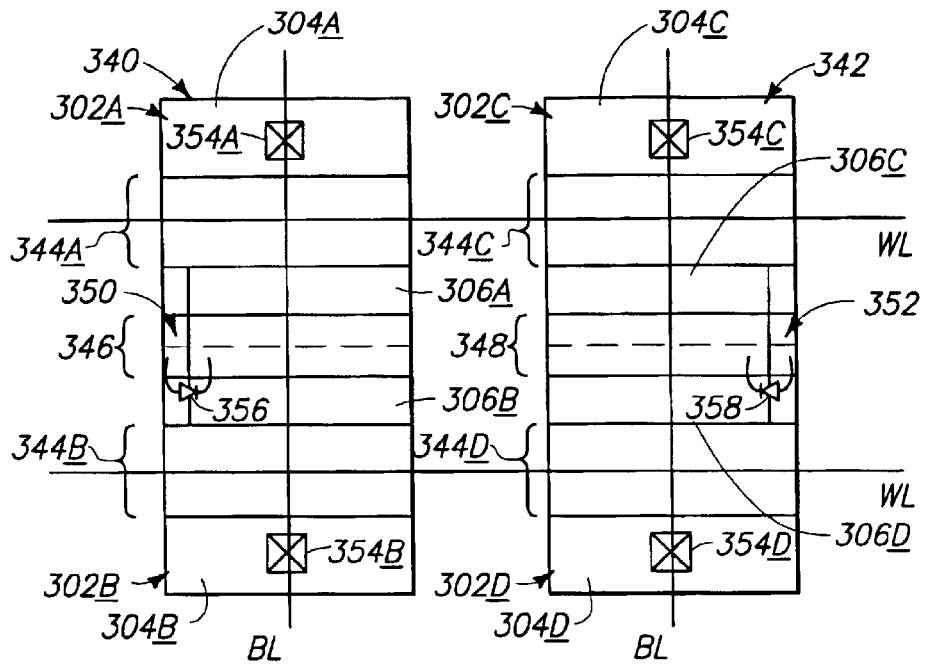
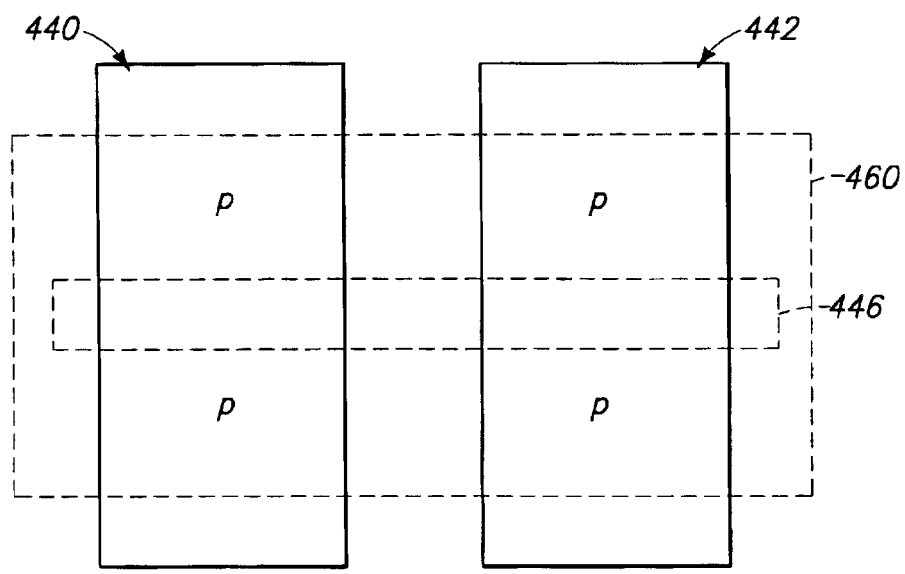

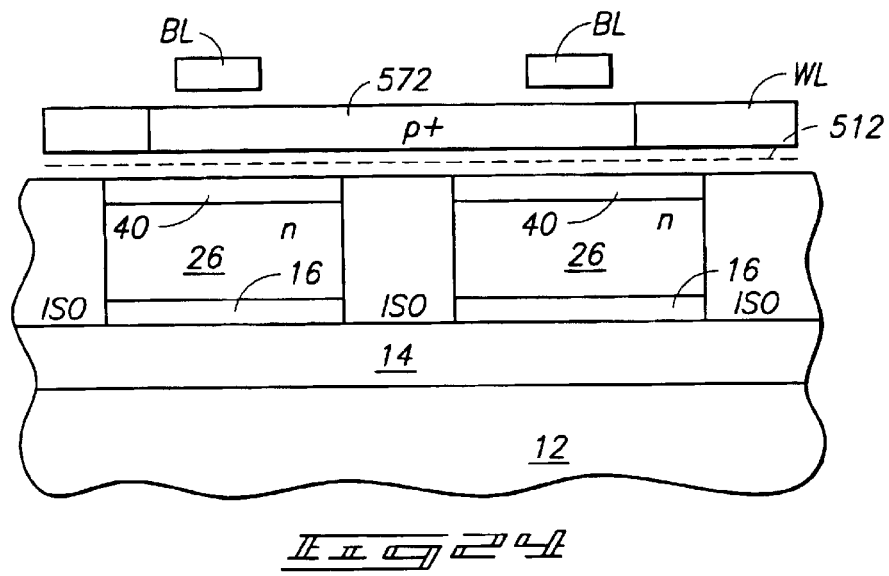
_FIG. 24_
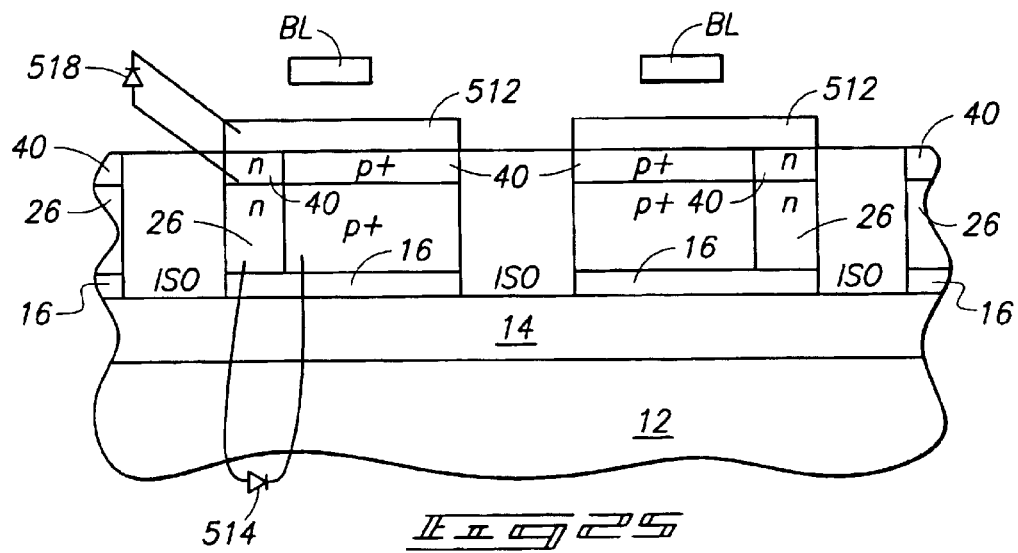
_FIG. 25_

NON-VOLATILE RANDOM ACCESS MEMORY CELLS ASSOCIATED WITH THIN FILM CONSTRUCTIONS

TECHNICAL FIELD

The invention pertains to memory devices, memory cells, and electronic systems.

BACKGROUND OF THE INVENTION

SOI technology differs from traditional bulk semiconductor technologies in that the active semiconductor material of SOI technologies is typically much thinner than that utilized in bulk technologies. The active semiconductor material of SOI technologies will typically be formed as a thin film over an insulating material (typically oxide), with exemplary thicknesses of the semiconductor film being less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An exemplary integrated circuit device that can be formed utilizing SOI technologies is a so-called thin film transistor (TFT), with the term "thin film" referring to the thin semiconductor film of the SOI construction. In particular aspects, the semiconductor material of the SOI construction can be silicon, and in such aspects the TFTs can be fabricated using recrystallized amorphous silicon or polycrystalline silicon. The silicon can be supported by an electrically insulative material (such as silicon dioxide), which in turn is supported by an appropriate substrate. Exemplary substrate materials include glass, bulk silicon and metal-oxides (such as, for example, $Al_2O_3$). If the semiconductor material comprises silicon, the term SOI is occasionally utilized to refer to a silicon-on-insulator construction, rather than the more general concept of a semiconductor-on-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon; including, for example, germanium.

A problem associated with conventional TFT constructions is that grain boundaries and defects can limit carrier mobilities. Accordingly, carrier mobilities are frequently nearly an order of magnitude lower than they would be in bulk semiconductor devices. High voltage (and therefore high power consumption), and large areas are utilized for the TFTs, and the TFTs exhibit limited performance. TFTs thus have limited commercial application and currently are utilized primarily for large area electronics.

Various efforts have been made to improve carrier mobility of TFTs. Some improvement is obtained for devices in which silicon is the semiconductor material by utilizing a thermal anneal for grain growth following silicon ion implantation and hydrogen passivation of grain boundaries (see, for example, Yamauchi, N. et al., "Drastically Improved Performance in Poly-Si TFTs with Channel Dimensions Comparable to Grain Size", IEDM Tech. Digest, 1989, pp. 353–356). Improvements have also been made in devices in which a combination of silicon and germanium is the semiconductor material by optimizing the germanium and hydrogen content of silicon/germanium films (see, for example, King, T. J. et al, "A Low-Temperature (<=550° C.) Silicon-Germanium MOS TFT Technology for Large-Area Electronics", IEDM Tech. Digest, 1991, pp. 567–570).

Investigations have shown that nucleation, direction of solidification, and grain growth of silicon crystals can be controlled selectively and preferentially by excimer laser annealing, as well as by lateral scanning continuous wave laser irradiation/anneal for recrystallization (see, for example, Kuriyama, H. et al., "High Mobility Poly-Si TFT by a New Excimer Laser Annealing Method for Large Area Electronics", IEDM Tech. Digest, 1991, pp. 563–566; Jeon, J. H. et al., "A New Poly-Si TFT with Selectively Doped Channel Fabricated by Novel Excimer Laser Annealing", IEDM Tech. Digest, 2000, pp. 213–216; Kim, C. H. et al., "A New High -Performance Poly-Si TFT by Simple Excimer Laser Annealing on Selectively Floating a Si Layer", IEDM Tech. Digest, 2001, pp. 753–756; Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209–212; and Hara, A. et al., "High Performance Poly-Si TFTs on a Glass by a Stable Scanning CW Laser Lateral Crystallization", IEDM Tech. Digest, 2001, pp. 747–750). Such techniques have allowed relatively defect-free large crystals to be grown, with resulting TFTs shown to exhibit carrier mobility over 300 $cm^2$/V-second.

Another technique which has shown promise for improving carrier mobility is metal-induced lateral recrystallization (MILC), which can be utilized in conjunction with an appropriate high temperature anneal (see, for example, Jagar, S. et al., "Single Grain TFT with SOI CMOS Performance Formed by Metal-Induced-Lateral-Crystallization", IEDM Tech. Digest, 1999, p. 293–296; and Gu, J. et al., "High Performance Sub-100 nm Si TFT by Pattern-Controlled Crystallization of Thin Channel Layer and High Temperature Annealing", DRC Conference Digest, 2002, pp. 49–50). A suitable post-recrystallization anneal for improving the film quality within silicon recrystallized by MILC is accomplished by exposing recrystallized material to a temperature of from about 850° C. to about 900° C. under an inert ambient (with a suitable ambient comprising, for example, $N_2$). MILC can allow nearly single crystal silicon grains to be formed in predefined amorphous-silicon islands for device channel regions. Nickel-induced-lateral-recrystallization can allow device properties to approach those of single crystal silicon.

The carrier mobility of a transistor channel region can be significantly enhanced if the channel region is made of a semiconductor material having a strained crystalline lattice (such as, for example, a silicon/germanium material having a strained lattice, or a silicon material having a strained lattice) formed over a semiconductor material having a relaxed lattice (such as, for example, a silicon/germanium material having a relaxed crystalline lattice). (See, for example, Rim, K. et al., "Strained Si NMOSFETs for High Performance CMOS Technology", VLSI Tech. Digest, 2001, p. 59–60; Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13–14; Huang, L. J. et al., "Carrier Mobility Enhancement in Strained Si-on-Insulator Fabricated by Wafer Bonding", VLSI Tech. Digest, 2001, pp. 57–58; and Mizuno, T. et al., "High Performance CMOS Operation of Strained-SOI MOSFETs Using Thin Film SiGe-on-Insulator Substrate", VLSI Tech. Digest, 2002, p. 106–107.)

The terms "relaxed crystalline lattice" and "strained crystalline lattice" are utilized to refer to crystalline lattices which are within a defined lattice configuration for the semiconductor material, or perturbed from the defined lattice configuration, respectively. In applications in which the relaxed lattice material comprises silicon/germanium having a germanium concentration of from 10% to 60%, mobility enhancements of 110% for electrons and 60–80% for holes can be accomplished by utilizing a strained lattice material in combination with the relaxed lattice material (see for example, Rim, K. et al., "Characteristics and Device Design of Sub-100 nm Strained SiN and PMOSFETs", VLSI Tech. Digest, 2002, 00. 98–99; and Huang, L. J. et al., "Carrier Mobility Enhancement in Strained Si-on-Insulator Fabricated by Wafer Bonding", VLSI Tech. Digest, 2001, pp. 57–58).

Performance enhancements of standard field effect transistor devices are becoming limited with progressive lithographic scaling in conventional applications. Accordingly, strained-lattice-channeled-field effect transistors on relaxed silicon/germanium offers an opportunity to enhance device performance beyond that achieved through conventional lithographic scaling. IBM recently announced the world's fastest communications chip following the approach of utilizing a strained crystalline lattice over a relaxed crystalline lattice (see, for example, "IBM Builds World's Fastest Communications Microchip", Reuters U.S. Company News, Feb. 25, 2002; and Markoff, J., "IBM Circuits are Now Faster and Reduce Use of Power", The New York Times, Feb. 25, 2002).

Although various techniques have been developed for substantially controlling nucleation and grain growth processes of semiconductor materials, grain orientation control is lacking. Further, the post-anneal treatment utilized in conjunction with MILC can be unsuitable in applications in which a low thermal budget is desired. Among the advantages of the invention described below is that such can allow substantial control of crystal grain orientation within a semiconductor material, while lowering thermal budget requirements relative to conventional methods. Additionally, the quality of the grown crystal formed from a semiconductor material can be improved relative to that of conventional methods.

In a further aspect of the background, known dynamic random access memory (DRAM) devices include a switching transistor and an integrated storage capacitor tied to the storage node of the transistor. Incorporating a stacked capacitor or a trenched capacitor in parallel with the depletion capacitance of the floating storage node enhances charge storage. Due to a finite charge leakage across the depletion layer, the capacitor is frequently recharged or refreshed to insure data integrity in the DRAM device. Thus, DRAM devices are volatile memory devices. A power failure causes permanent data loss in the DRAM device. DRAM devices are relatively inexpensive, power efficient, and fast compared to conventional flash or other non-volatile random access memory (NVRAM) devices.

NVRAM devices, such as Flash, EPROM, EEPROM, etc., store charge using a floating gate or a floating plate. Charge trapping centers and associated potential wells are created by forming nano-particles of metals or semiconductors in the large band gap insulating matrix, or by forming nano-layers of metal, semiconductor or small band gap insulators that interface with one or more large band gap insulating layers. The floating plate or gate can be formed as an integral part of the gate insulator stack of the switching transistor.

Floating plate non-volatile memory devices have been formed using a gate insulator stack with silicon-rich insulators. In these devices, injected charges (electrons or holes) are trapped and retained in local quantum wells provided by nano-particles of silicon embedded in a matrix of high band gap insulators such as silicon dioxide ($SiO_2$) or silicon nitride ($Si_3N_4$). In addition to silicon trapping centers, other trapping centers include tungsten particles embedded in $SiO_2$, gold particles embedded in $SiO_2$, and a tungsten oxide layer embedded in $SiO_2$.

Field emission across the surrounding insulator causes the stored charge to leak. The stored charge leakage from the floating plate or floating gate is negligible for non-volatile memory devices because of the high band gap insulator. For example, silicon dioxide ($SiO_2$) has a 9 ev band gap, and oxide-nitride-oxide (ONO) and other insulators have a band gap in the range of 4.5 ev to 9 ev. Thus, the memory device retains stored data throughout the device's lifetime.

There are, however, problems associated with NVRAM devices. The writing process, also referred to as "write-erase programming," for non-volatile memory is slow and energy inefficient, and requires complex high voltage circuitry for generating and routing high voltage. Additionally, the write-erase programming for non-volatile memory involves high-field phenomenon (hot carrier or field emission) that degrades the surrounding insulator. The degradation of the insulator eventually causes significant leakage of the stored charge. Thus, the high-field phenomenon negatively affects the endurance (the number of write/erase cycles) of the NVRAM devices. The number of cycles of writing and erasing for floating gate devices is typically limited to $1 \times 10^6$ cycles. Therefore, the available applications for conventional NVRAM devices is limited.

It is therefore desired to develop improved NVRAM devices. There is a need in the industry to achieve an NVRAM device which could replace DRAM in speed, power and cost, and simultaneously provide non-volatile data storage.

SUMMARY OF THE INVENTION

In one aspect, the invention encompasses an NVRAM device associated with a thin film construction. The device can include a crystalline layer separated from a substrate by an insulative material, with the crystalline layer being less than or equal to 2000 angstroms thick and comprising silicon/germanium. A gate is supported by the crystalline layer, and a pair of source/drain regions are proximate the gate and extend into the crystalline layer. The portion of the source/drain regions within the crystalline layer is contained within a single crystal of the silicon/germanium. A channel region extends between the source/drain regions, and is part of a body region of the memory device that is oppositely doped relative to the source/drain regions. A gate insulator stack is between the channel region and the gate. The gate insulator stack includes a floating plate which is electrically connected to one of the source/drain regions. A diode electrically connects said one of the source/drain regions to the body region.

The invention also encompasses electronic systems comprising novel NVRAM devices.

Particular memory cells of the invention can be referred to as non-volatile dynamic random access memory (NVDRAM) because of the DRAM-read-write capabilities of the cells. However, the term NVDRAM should not be read to limit the memory cells of the present invention.

BRIEF DESCRIPTION OF THE DRAWINGS

Preferred embodiments of the invention are described below with reference to the following accompanying drawings.

FIG. 2 is a diagrammatic, cross-sectional view of a fragment of a semiconductor construction shown at a preliminary stage of an exemplary process of the present invention FIG. 3 is a view of the FIG. 2 fragment shown at a processing stage subsequent to that of FIG. 2.

FIG. 4 is a view of the FIG. 2 fragment shown at a processing stage subsequent to that of FIG. 3.

FIG. 5 is a view of the FIG. 2 fragment shown at a processing stage subsequent to that of FIG. 4.

FIG. 6 is a view of the FIG. 2 fragment shown at a processing stage subsequent to that of FIG. 5.

FIG. 7 is a view of the FIG. 2 fragment shown at a processing stage subsequent to that of FIG. 6.

FIG. 12 is a diagrammatic, fragmentary view of NVRAM array illustrating four adjacent NVRAM cells having NFET transistors, and further illustrating bitline and wordline representations superimposed on the array, according to an exemplary aspect of the present invention.

FIGS. 13–16 illustrate processes for fabricating the NVRAM array of FIG. 12, according to an exemplary aspect of the present invention.

FIG. 24 illustrates a cross-sectional view taken along the line 24—24 of FIG. 21.

FIG. 25 illustrates a cross-sectional view taken along the line 25—25 of FIG. 21.

DETAILED DESCRIPTION OF THE PREFERRED EMBODIMENTS

In particular aspects, the present invention relates to NVRAM cells. Exemplary non-volatile memory cells include a transistor with a floating plate and at least one built-in diode. Charge trapping centers are provided in the gate insulator stack by interfacing conducting metal-silicides with appropriate metal-oxides (and in various embodiments, by interfacing transition metal suicides with transition metal oxides) to achieve desired charge trapping and retention characteristics.

In CMOS technology, the built-in lateral n+/n−/p diode of the source-substrate part of the FET can be characterized to have relatively low reverse breakdown voltage and relatively high reverse leakage (approximately greater than or equal to $10^{-6}$ A/cm$^2$) with respect to a Schottky diode with negligible forward current up to a forward bias of 0.6 volt. In various embodiments, Schottky barrier heights for metal or metal silicide-silicon (p-type or n-type) are varied by selecting an appropriate metal or metal-silicide to be part of a low-barrier Schottky diode or part of a high-barrier Schottky diode. The Schottky diode is a majority carrier device, and as such has a relatively fast time constant. A Schottky diode can be fabricated to have a very low reverse leakage (for example, the reverse leakage can be much less than $1\times10^{-8}$ A/cm$^2$), and to conduct a large forward current at negligible forward voltage drop (for example, approximately 0.6 to 0.7 volts).

Various aspects of the present invention can utilize characteristic differences of Schottky and lateral diodes to write and erase a memory cell. Additionally, nano-layers of metal/metal oxides (and in various embodiments, transition metal/metal oxides) are capable of being readily fabricated by atomic layer deposition (ALD) techniques. Exemplary aspects of the present invention utilize ALD techniques to create the gate insulator stack of a memory cell.

Figure 1A:
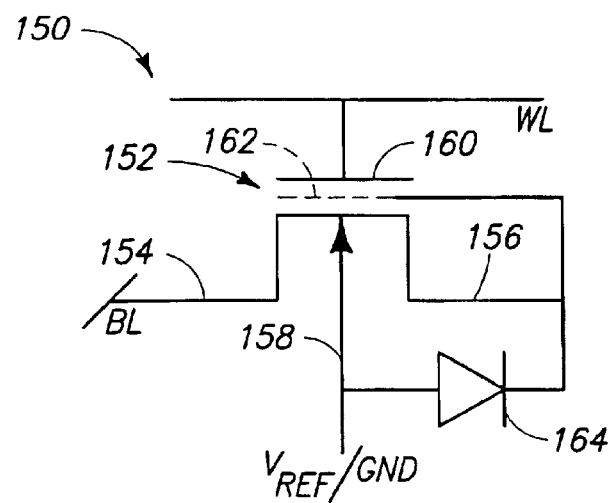
FIG. 1A is a schematic illustration of an exemplary NVRAM device according to an aspect of the present invention.

FIG. 1A is a schematic illustration of a NVRAM access memory according to an exemplary aspect of the present invention. The illustrated NVRAM cell 150 includes an NFET transistor 152. It is to be understood, however, that the present invention is not limited to NFET transistors. Transistor 152 includes a first diffusion region (for example, a drain) 154 connected to a bitline (BL) of the cell 150, a second diffusion region (for example, a source) 156 that functions as an extension of a storage node. A body 158 is formed by a substrate or a well. A gate 160 is connected to a wordline (WL) and a floating plate 162 as an integral part of the gate insulator stack of the NFET transistor 152.

The body region 158 is connected to a reference voltage ($V_{REF}$), such as ground (GND). In an NFET transistor 152, the body region 158 is a p-type semiconductor and the diffusion region 156 is an n+ semiconductor. The body region 158 and the second diffusion region 156 are designed to provide a built-in lateral p–n+ semiconductor junction diode 164. The second diffusion region 156 is electrically connected to the floating plate 162 of the gate insulator stack. In various embodiments, and as will be shown in more detail below, a layer of conducting metal-silicide interfacing a trapping medium of metal oxide can form the floating plate 112 and the gate insulator stack, and such can contact the second diffusion region 156.

When the lateral junction diode 164 is reverse-biased, electrons accumulate on the floating plate 162, subsequently get trapped into the metal oxide, and cause memory cell 150 to be written. In various embodiments, memory cell 150 can be erased by injecting hot hole carriers and utilizing avalanche breakdown to neutralize trapped electrons. In some embodiments, memory cell 150 is erased by appropriately imposing a potential across the gate dielectric to remove the trapped electrons by tunneling from the trapping medium interfacing the floating plate either to the top electrode or to the substrate. In particular embodiments, the memory cell 150 is erased by forward biasing a Schottky diode, which is generally illustrated in FIG. 1C. As is described in more detail later in this disclosure, the Schottky diode is capable of being fabricated as a low forward voltage drop and a high current device to provide the cell with desired erase characteristics.

Figure 1B:
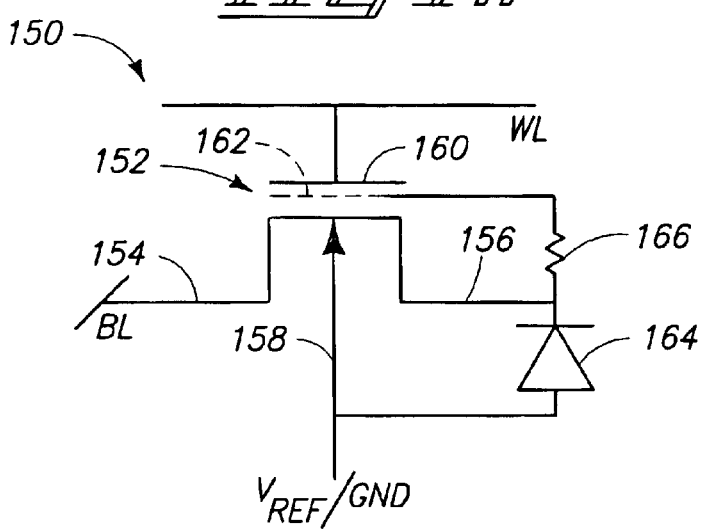
FIG. 1B is a schematic illustration of an exemplary NVRAM device according to an aspect of the present invention.
Figure 1C:
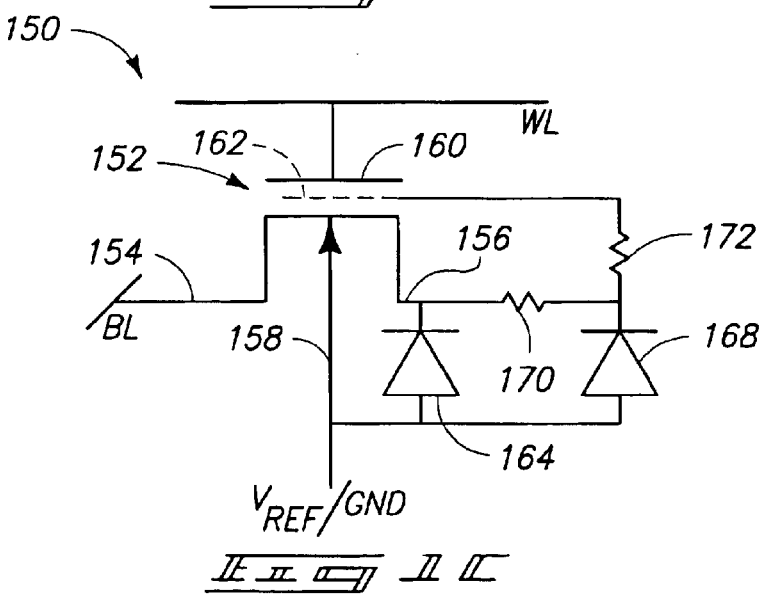
FIG. 1C is a schematic illustration of an exemplary NVRAM device according to an aspect of the present invention.

FIG. 1B is a schematic illustration of an exemplary NVRAM according to particular aspects of the present invention. The NVRAM includes a lateral semiconductor junction (p–n+) diode 164 extending from the body region 158 to the second diffusion region 156. An ohmic connection associated with the metal-silicide between the second diffusion region 156 and the floating plate 162 is illustrated as a resistor 166.

FIG. 1C is a schematic illustration of an exemplary NVRAM according to particular aspects of the present invention. Such NVRAM includes a Schottky diode 168 formed in parallel with the lateral semiconductor junction (p–n+) diode 164. The Schottky diode is formed between the metal silicide and the body region 158 by selectively interfacing metal-silicide with the p-type body 158. Resistor 170 illustrates the contact resistance of the interface between the second diffusion region 156 and the metal-silicide. Resistor 172 illustrates the ohmic connection to the floating plate 162 associated with the metal-silicide.

In particular embodiments, the NVRAM can incorporate a floating plate gate insulator stack for the transfer gate, and can provide particularly useful methods of trapping (also referred to herein as charging or writing) and de-trapping (also referred to herein as discharging or erasing) the floating plate 162 via a combination of built-in lateral and Schottky diodes 164 and 168 at a storage node 156 which is electrically tied to the floating gate 162. The trapping and de-trapping of the floating plate can also be referred to herein as programming. The entire memory cell 150 can be integrated within a single transistor, and such can be considered to be a one device configuration. During writing (high: "1") and erasing (low: "0") the parallel diodes 164 and 168 are respectively reverse and forward biased. Also, the reverse-biased n+–p lateral diode 164 is active during writing and supplies electrons that are trapped at the trapping medium of metal oxide interfacing floating plate 162, (the trapping media and plate 162 can together be referred to as a floating plate/trapping insulator stack). Such trapped electrons raise the threshold of the cell transistor 152. Thus, the reverse-biased lateral semiconductor junction diode 164 charges that floating plate/trapping insulator stack. During erasing, the forward-biased silicide Schottky diode 168 is active and supplies holes to neutralize the traps in the floating plate/trapping insulator stack, thereby lowering the threshold of the cell transistor 152.

Time constants associated with charge transfer and trapping/detrapping can be very fast, and can result in programming speeds that are improved by many orders of magnitude relative to conventional devices. At the written "1" state, the threshold voltage ($V_T$) of the device (NFET) is raised due to electrons trapped in the floating plate/trapping insulator stack and the transistor is non-conducting. At the erase state (written "0"), the threshold voltage ($V_T$) is low and the device is conducting. Reading "1" or "0" is accomplished much the same way as standard SRAM or EPROM methodology, and can therefore be very fast.

The dynamics of trapped charge leakage (charge retention) can depend on the band gap of the materials selected for the floating plate insulator stack. Charge retention can be improved by many orders of magnitude over leakage mechanisms associated with the reverse-biased p–n junctions of DRAM devices. Charge transport to and from the charge centers during writing and erasing is typically by direct tunneling, and can be exponentially dependent on the potential across charge centers and the conducting plate. However, the field across the gate insulator stack during such operations is typically significantly lower than those of conventional non-volatile devices. As a result, endurance (number of write/erase operations) is expected to be comparable to conventional DRAM devices. Memory arrays using NVRAM devices of the present invention are expected to have speed/power which can be equal to or better than conventional DRAM, while storing data relatively permanently into the memory cells and providing substantial data non-volatility.

Referring to FIG. 2, a fragment of a semiconductor construction 10 is illustrated at a preliminary processing stage. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 comprises a base (or substrate) 12 and an insulator layer 14 over the base. Base 12 can comprise, for example, one or more of glass, aluminum oxide, silicon dioxide, metal and plastic. Additionally, and/or alternatively, base 12 can comprise a semiconductor material, such as, for example, a silicon wafer.

Layer 14 comprises an electrically insulative material, and in particular applications can comprise, consist essentially of, or consist of silicon dioxide. In the shown construction, insulator layer 14 is in physical contact with base 12. It is to be understood, however, that there can be intervening materials and layers provided between base 12 and layer 14 in other aspects of the invention (not shown). For example, a chemically passive thermally stable material, such as silicon nitride ($Si_3N_4$), can be incorporated between base 12 and layer 14. Layer 14 can have a thickness of, for example, from about 200 nanometers to about 500 nanometers, and can be referred to as a buffer layer.

Layer 14 preferably has a planarized upper surface. The planarized upper surface can be formed by, for example, chemical-mechanical polishing.

A layer 16 of semiconductive material is provided over insulator layer 14. In the shown embodiment, semiconductive material layer 16 is formed in physical contact with insulator 14. Layer 16 can have a thickness of, for example, from about 5 nanometers to about 10 nanometers. Layer 16 can, for example, comprise, consist essentially of, or consist of either doped or undoped silicon. If layer 16 comprises, consists essentially of, or consists of doped silicon, the dopant concentration can be from about $10^{14}$ atoms/cm$^3$ to about $10^{20}$ atoms/cm$^3$. The dopant can be either n-type or p-type, or a combination of n-type and p-type.

The silicon utilized in layer 16 can be either polycrystalline silicon or amorphous silicon at the processing stage of FIG. 2. It can be advantageous to utilize amorphous silicon in that it is typically easier to deposit a uniform layer of amorphous silicon than to deposit a uniform layer of polycrystalline silicon.

Referring to FIG. 3, material 16 is patterned into a plurality of discrete islands (or blocks) 18. Such can be accomplished utilizing, for example, photoresist (not shown) and photolithographic processing, together with an appropriate etch of material 16.

A capping layer 20 is provided over islands 18 and over portions of layer 14 exposed between the islands. Layer 20 can, for example, comprise, consist essentially of, or consist of one or both of silicon dioxide and silicon. Layer 20 can also comprise multiple layers of silicon dioxide, stress-free silicon oxynitride, and silicon.

After formation of capping layer 20, small voids (nanovoids) and small crystals are formed in the islands 18. The formation of the voids and crystals can be accomplished by ion implanting helium 22 into material 16 and subsequently exposing material 16 to laser-emitted electromagnetic radiation. The helium can aid in formation of the nanovoids; and the nanovoids can in turn aid in crystallization and stress relief within the material 16 during exposure to the electromagnetic radiation. The helium can thus allow crystallization to occur at lower thermal budgets than can be achieved without the helium implantation. The helium is preferably implanted selectively into islands 18 and not into regions between the islands. The exposure of construction 10 to electromagnetic radiation can comprise subjecting the construction to scanned continuous wave laser irradiation while the construction is held at an appropriate elevated temperature (typically from about 300° C. to about 450° C.). The exposure to the electromagnetic radiation can complete formation of single crystal seeds within islands 18. The laser irradiation is scanned along an axis 24 in the exemplary shown embodiment.

The capping layer 20 discussed previously is optional, but can beneficially assist in retaining helium within islands 18 and/or preventing undesirable impurity contamination during the treatment with the laser irradiation.

Referring to FIG. 4, islands 18 are illustrated after voids have been formed therein. Additionally, small crystals (not shown) have also been formed within islands 18 as discussed above.

Capping layer 20 (FIG. 3) is removed, and subsequently a layer 26 of semiconductive material is formed over islands 18. Layer 26 can comprise, consist essentially of, or consist of silicon and germanium; or alternatively can comprise, consist essentially of, or consist of doped silicon/germanium. The germanium concentration within layer 26 can be, for example, from about 10 atomic percent to about 60 atomic percent. In the shown embodiment, layer 26 physically contacts islands 18, and also physically contacts insulator layer 14 in gaps between the islands. Layer 26 can be formed to a thickness of, for example, from about 50 nanometers to about 100 nanometers, and can be formed utilizing a suitable deposition method, such as, for example, plasma-assisted chemical vapor deposition.

A capping layer 28 is formed over semiconductor layer 26. Capping layer 28 can comprise, for example, silicon dioxide. Alternatively, capping layer 28 can comprise, for example, a combination of silicon dioxide and stress-free silicon oxynitride. Capping layer 28 can protect a surface of layer 26 from particles and contaminants that could otherwise fall on layer 26. If the processing of construction 10 occurs in an environment in which particle formation and/or incorporation of contaminants is unlikely (for example, an ultrahigh vacuum environment), layer 28 can be eliminated from the process. Layer 28 is utilized in the patterning of a metal (discussed below). If layer 28 is eliminated from the process, other methods besides those discussed specifically herein can be utilized for patterning the metal.

Referring to FIG. 5, openings 30 are extended through capping layer 28 and to an upper surface of semiconductive material 26. Openings 30 can be formed by, for example, photolithographic processing to pattern a layer of photoresist (not shown) into a mask, followed by a suitable etch of layer 28 and subsequent removal of the photoresist mask.

A layer 32 of metal-containing material is provided within openings 30, and in physical contact with an upper surface of semiconductive material 26. Layer 32 can have a thickness of, for example, less than or equal to about 10 nanometers. The material of layer 32 can comprise, consist essentially of, or consist of, for example, nickel. Layer 32 can be formed by, for example, physical vapor deposition. Layer 32 can be formed to be within openings 30 and not over material 28 (as is illustrated in FIG. 5) by utilizing deposition conditions which selectively form metal-containing layer 32 on a surface of material 26 relative to a surface of material 28. Alternatively, material 32 can be deposited by a substantially non-selective process to form the material 32 over the surface of material 28 as well as over the surface of material 26 within openings 30, and subsequently material 32 can be selectively removed from over surfaces of material 28 while remaining within openings 30. Such selective removal can be accomplished by, for example, chemical-mechanical polishing, and/or by forming a photoresist mask (not shown) over the material 32 within openings 30, while leaving other portions of material 32 exposed, and subsequently removing such other portions to leave only the segments of material 32 within openings 30. The photoresist mask can then be removed.

Oxygen 34 is ion implanted through layers 26 and 28, and into layer 16 to oxidize the material of layer 16. For instance, if layer 16 consists of silicon, the oxygen can convert the silicon to silicon dioxide. Such swells the material of layer 16, and accordingly fills the nanovoids that had been formed earlier. The oxygen preferably only partially oxidizes layer 16, with the oxidation being sufficient to fill all, or at least substantially all, of thenanovoids; but leaving at least some of the seed crystals within layer 16 that had been formed with the laser irradiation discussed previously. In some aspects, the oxidation can convert a lower portion of material 16 to silicon dioxide while leaving an upper portion of material 16 as non-oxidized silicon.

The oxygen ion utilized as implant 34 can comprise, for example, oxygen ($O_2$) or ozone ($O_3$). The oxygen ion implant can occur before or after formation of openings 30 and provision of metal-containing layer 32.

Construction 10 is exposed to continuous wave laser irradiation while being held at an appropriate temperature (which can be, for example, from about 300° C. to about 450° C.; or in particular applications can be greater than or equal to 550° C.) to cause transformation of at least some of layer 26 to a crystalline form. The exposure to the laser irradiation comprises exposing the material of construction 10 to laser-emitted electromagnetic radiation scanned along a shown axis 36. Preferably, the axis 36 along which the laser irradiation is scanned is the same axis that was utilized for scanning of laser irradiation in the processing stage of FIG. 3.

The crystallization of material 26 (which can also be referred to as a recrystallization of the material) is induced utilizing metal-containing layer 32, and accordingly corresponds to an application of MILC. The MILC transforms material 26 to a crystalline form and the seed layer provides the crystallographic orientation while undergoing partial oxidation.

The crystal orientation within crystallized layer 26 can originate from the crystals initially formed in islands 18. Accordingly, crystal orientations formed within layer 26 can be controlled through control of the crystal orientations formed within the semiconductive material 16 of islands 18.

The oxidation of part of material 16 which was described previously can occur simultaneously with the MILC arising from continuous wave laser irradiation. Partial oxidation of seed layer 16 facilitates: (1) Ge enrichment into Si—Ge layer 26 (which improves carrier mobility); (2) stress-relief of Si—Ge layer 26; and (3) enhancement of recrystallization of Si—Ge layer 26. The crystallization of material 26 can be followed by an anneal of material 26 at a temperature of, for example, about 900° C. for a time of about 30 minutes, or by an appropriate rapid thermal anneal, to further ensure relaxed, defect-free crystallization of material 26. This annealing option is dependent on the thermal stability of the material selected for substrate 12.

FIG. 6 shows construction 10 after the processing described above with reference to FIG. 5. Specifically, the voids that had been in material 16 are absent due to the oxidation of material 16. Also, semiconductive material 26 has been transformed into a crystalline material (illustrated diagrammatically by the cross-hatching of material 26 in FIG. 6). Crystalline material 26 can consist of a single large crystal, and accordingly can be monocrystalline. Alternatively, crystalline material 26 can be polycrystalline. If crystalline material 26 is polycrystalline, the crystals of the material will preferably be equal in size or larger than the blocks 18. In particular aspects, each crystal of the polycrystalline material can be about as large as one of the shown islands 18. Accordingly, the islands can be associated in a one-to-one correspondence with crystals of the polycrystalline material.

The shown metal layers 32 are effectively in a one-to-one relationship with islands 18, and such one-to-one correspondence of crystals to islands can occur during the MILC. Specifically, single crystals can be generated relative to each of islands 18 during the MILC process described with reference to FIG. 5. It is also noted, however, that although the metal layers 32 are shown in a one-to-one relationship with the islands in the cross-sectional views of FIGS. 5 and 6, the construction 10 comprising the shown fragment should be understood to extend three dimensionally. Accordingly, the islands 18 and metal layers 32 can extend in directions corresponding to locations into and out of the page relative to the shown cross-sectional view. There can be regions of the construction which are not shown where a metal layer overlaps with additional islands besides the shown islands.

Referring to FIG. 7, layers 28 and 32 (FIG. 6) are removed, and subsequently a layer 40 of crystalline semiconductive material is formed over layer 26. In typical applications, layer 26 will have a relaxed crystalline lattice and layer 40 will have a strained crystalline lattice. As discussed previously, layer 26 will typically comprise both silicon and germanium, with the germanium being present to a concentration of from about 10 atomic percent to about 60 atomic percent. Layer 40 can comprise, consist essentially of, or consist of either doped or undoped silicon; or alternatively can comprise, consist essentially of, or consist of either doped or undoped silicon/germanium. If layer 40 comprises silicon/germanium, the germanium content can be from about 10 atomic percent to about 60 atomic percent.

Strained lattice layer 40 can be formed by utilizing methods similar to those described in, for example, Huang, L. J. et al., "Carrier Mobility Enhancement in Strained Si-on-Insulator Fabricated by Wafer Bonding", VLSI Tech. Digest, 2001, pp. 57–58; and Cheng, Z. et al., "SiGe-On-insulator (SGOI) Substrate Preparation and MOSFET Fabrication for Electron Mobility Evaluation" 2001 IEEE SOI Conference Digest, October 2001, pp. 13–14.

Strained lattice layer 40 can be large polycrystalline or monocrystalline. If strained lattice layer 40 is polycrystalline, the crystals of layer 40 can be large and in a one-to-one relationship with the large crystals of a polycrystalline relaxed crystalline layer 26. Strained lattice layer 40 is preferably monocrystalline over the individual blocks 18.

The strained crystalline lattice of layer 40 can improve mobility of carriers relative to the material 26 having a relaxed crystalline lattice. However, it is to be understood that layer 40 is optional in various aspects of the invention.

Each of islands 18 can be considered to be associated with a separate active region 42, 44 and 46. The active regions can be separated from one another by insulative material subsequently formed through layers 26 and 40 (not shown). For instance, a trenched isolation region can be formed through layers 26 and 40 by initially forming a trench extending through layers 26 and 40 to insulative material 14, and subsequently filling the trench with an appropriate insulative material such as, for example, silicon dioxide.

As discussed previously, crystalline material 26 can be a single crystal extending across an entirety of the construction 10 comprising the shown fragment, and accordingly extending across all of the shown active regions. Alternatively, crystalline material 26 can be polycrystalline. If crystalline material 26 is polycrystalline, the single crystals of the polycrystalline material will preferably be large enough so that only one single crystal extends across a given active region. In other words, active region 42 will preferably comprise a single crystal of material 26, active region 44 will comprise a single crystal of the material, and active region 46 will comprise a single crystal of the material, with the single crystals being separate and discrete relative to one another.

Figure 8:
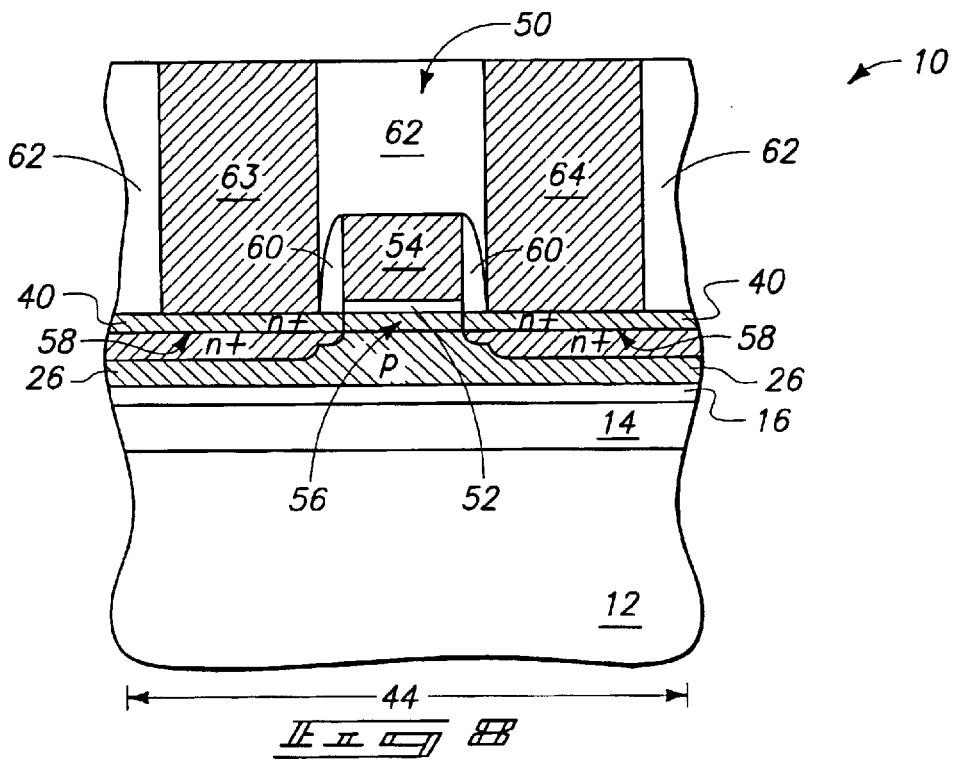
FIG. 8 is an expanded region of the FIG. 7 fragment shown at a processing stage subsequent to that of FIG. 7 in accordance with an exemplary embodiment of the present invention, and comprising an n-channel device.

FIG. 8 shows an expanded view of active region 44 at a processing stage subsequent to that of FIG. 7, and specifically shows a transistor device 50 associated with active region 44 and supported by crystalline material 26.

Transistor device 50 comprises a dielectric material 52 formed over strained lattice 40, and a gate 54 formed over dielectric material 52. Dielectric material 52 typically comprises silicon dioxide, and gate 54 typically comprises a stack including an appropriate conductive material, such as, for example, conductively-doped silicon and/or metal.

A channel region 56 is beneath gate 54, and in the shown construction extends across strained crystalline lattice material 40. The channel region may also extend into relaxed crystalline lattice material 26 (as shown). Channel region 56 is doped with a p-type dopant.

Transistor construction 50 additionally comprises source/drain regions 58 which are separated from one another by channel region 56, and which are doped with n-type dopant to an n+ concentration (typically, a concentration of at least $10^{21}$ atoms/cm$^3$). In the shown construction, source/drain regions 58 extend across strained lattice layer 40 and into relaxed lattice material 26. Although source/drain regions 58 are shown extending only partially through relaxed lattice layer 26, it is to be understood that the invention encompasses other embodiments (not shown) in which the source/drain regions extend all the way through relaxed material 26 and to material. 16.

Channel region 56 and source/drain regions 58 can be formed by implanting the appropriate dopants into crystalline materials 26 and 40. The dopants can be activated by rapid thermal activation (RTA), which can aid in keeping the thermal budget low for fabrication of field effect transistor 50.

An active region of transistor device 50 extends across source/drain regions 58 and channel region 56. Preferably the portion of the active region within crystalline material 26 is associated with only one single crystal of material 26. Such can be accomplished by having material 26 be entirely monocrystalline. Alternatively, material 26 can be polycrystalline and comprise an individual single grain which accommodates the entire portion of the active region that is within material 26. The portion of strained lattice material 40 that is encompassed by the active region is preferably a single crystal, and can, in particular aspects, be considered an extension of the single crystal of the relaxed lattice material 26 of the active region.

Crystalline materials 40 and 26 can, together with any crystalline structures remaining in material 16, have a total thickness of less than or equal to about 2000 Å. Accordingly the crystalline material can correspond to a thin film formed over an insulative material. The insulative material can be considered to be insulative layer 14 alone, or a combination of insulative layer 14 and oxidized portions of material 16.

The transistor structure 50 of FIG. 8 corresponds to an n-type field effect transistor (NFET), and in such construction it can be advantageous to have strained crystalline material 40 consist of a strained silicon material having appropriate dopants therein. The strained silicon material can improve mobility of electrons through channel region 56, which can improve performance of the NFET device relative to a device lacking the strained silicon lattice. Although it can be preferred that strained lattice material 40 comprise silicon in an NFET device, it is to be understood that the strained lattice can also comprise other semiconductive materials. A strained silicon lattice can be formed by various methods. For instance, strained silicon could be developed by various means and lattice 40 could be created by lattice mismatch with other materials or by geometric conformal lattice straining on another substrate (mechanical stress).

As mentioned above, strained lattice 40 can comprise other materials alternatively to, or additionally to, silicon. The strained lattice can, for example, comprise a combination of silicon and germanium. There can be advantages to utilizing the strained crystalline lattice comprising silicon and germanium relative to structures lacking any strained lattice. However, it is generally most preferable if the strained lattice consists of silicon alone (or doped silicon), rather than a combination of silicon and germanium for an NFET device.

A pair of sidewall spacers 60 are shown formed along sidewalls of gate 54, and an insulative mass 62 is shown extending over gate 54 and material 40. Conductive interconnects 63 and 64 extend through the insulative mass 62 to electrically connect with source/drain regions 58. Interconnects 63 and 64 can be utilized for electrically connecting transistor construction 50 with other circuitry external to transistor construction 50. Such other circuitry can include, for example, a bitline and a capacitor in applications in which construction 50 is incorporated into dynamic random access memory (DRAM).

Figure 9:
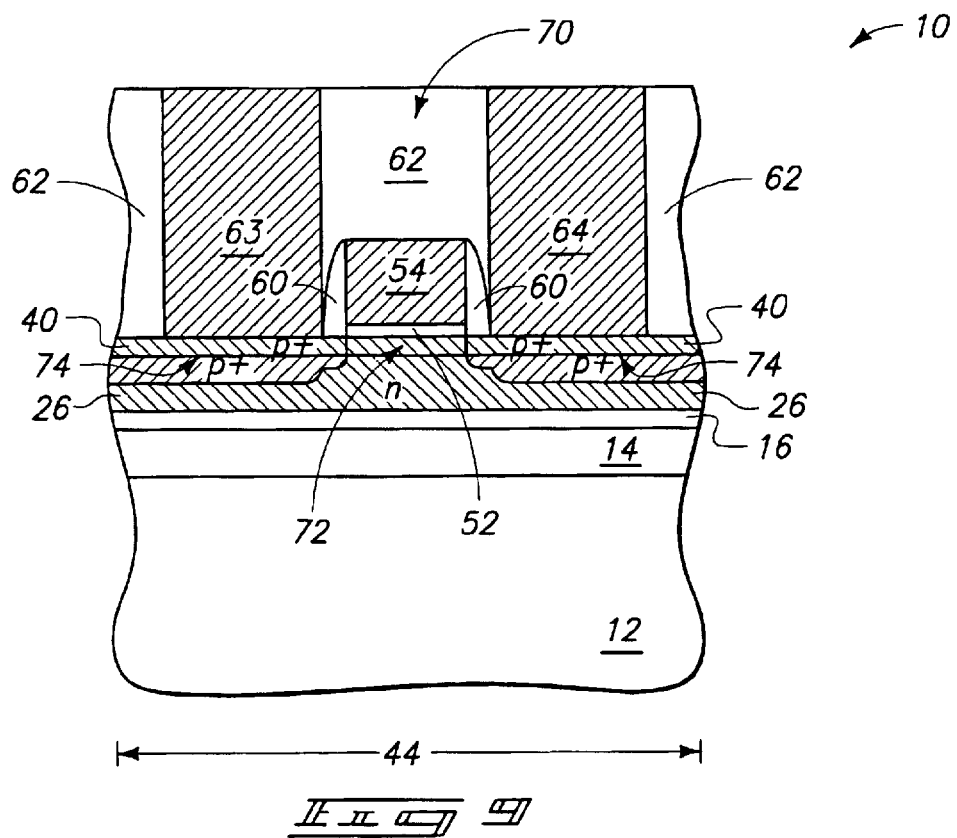
FIG. 9 is a view of an expanded region of FIG. 7 shown at a processing stage subsequent to that of FIG. 7 in accordance with an alternative embodiment relative to that of FIG. 8, and comprising a p-channel device.

FIG. 9 shows construction 10 at a processing stage subsequent to that of FIG. 7 and alternative to that described previously with reference to FIG. 8. In referring to FIG. 9, similar numbering will be used as is used above in describing FIG. 8, where appropriate.

A transistor construction 70 is shown in FIG. 9, and such construction differs from the construction 50 described above with reference to FIG. 8 in that construction 70 is a p-type field effect transistor (PFET) rather than the NFET of FIG. 8. Transistor device 70 comprises an n-type doped channel region 72 and p+-doped source/drain regions 74. In other words, the channel region and source/drain regions of transistor device 70 are oppositely doped relative to the channel region and source/drain regions described above with reference to the NFET device 50 of FIG. 8.

The strained crystalline lattice material 40 of the PFET device 70 can consist of appropriately doped silicon, or consist of appropriately doped silicon/germanium. It can be most advantageous if the strained crystalline lattice material 40 comprises appropriately doped silicon/germanium in a PFET construction, in that silicon/germanium can be a more effective carrier of holes with higher mobility than is silicon without germanium.

The transistor devices discussed above (NFET device 50 of FIG. 8, and PFET device 70 of FIG. 9) can be utilized in numerous constructions. For instance, the transistor devices can be utilized in NVRAM cells.

Figure 10:
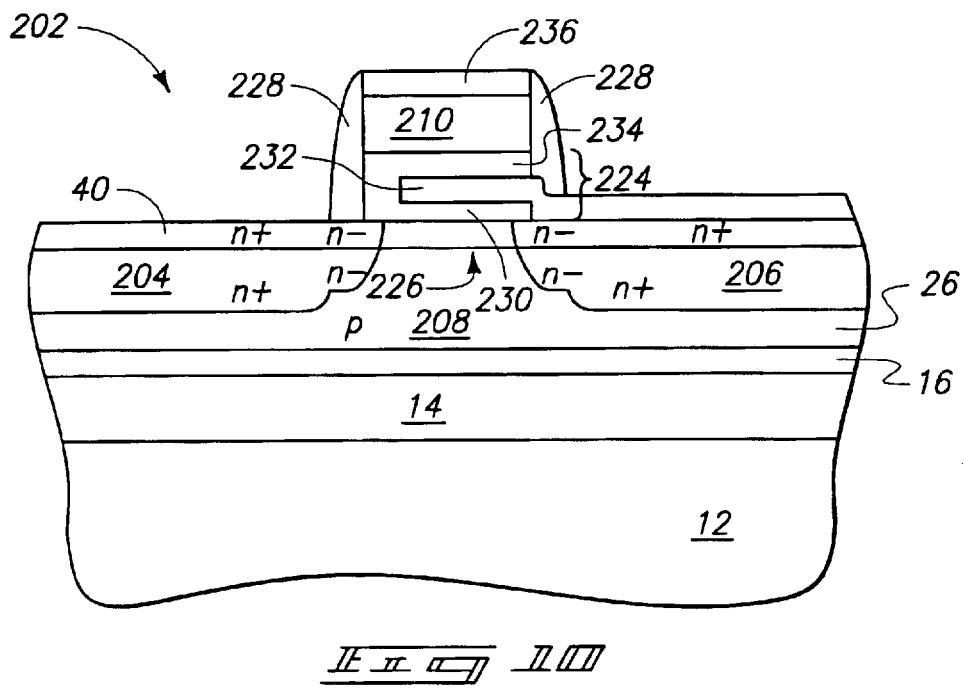
FIG. 10 illustrates a diagrammatic, cross-sectional view of an exemplary NVRAM device according to an aspect of the present invention.

FIG. 10 illustrates an exemplary NVRAM construction 202 in accordance with an aspect of the present invention. Construction 202 includes the semiconductor-on-insulator (SOI) features described previously with reference to FIGS. 2–7. Specifically, construction 202 comprises the semiconductor materials 26 and 40, and the insulator material 14 associated with a versatile substrate 12. As discussed above, semiconductor material 26 can comprise, for example, silicon/germanium having a relaxed crystalline lattice, and semiconductor material 40 can comprise a crystalline material having a strained crystalline lattice, with such crystalline material being, for example, either silicon or silicon/germanium. Insulative material 14 can comprise, for example, silicon dioxide. The layer 16 which was described above as being a silicon seed layer is shown between layers 14 and 26. The construction of FIG. 10 can be formed at a processing step subsequent to that of FIG. 7. Accordingly, layer 16 can predominately, or even entirely, comprise oxidized silicon. In other aspects, the oxidation of layer 16 can be eliminated, so that layer 16 predominately or entirely comprises non-oxidized crystalline material, such as, for example, non-oxidized crystalline silicon.

Substrate 12 can comprise, for example, one or more of glass, aluminum oxide, silicon dioxide, metal and plastic. Additionally, and/or alternatively, substrate 12 can comprise a semiconductor material such as, for example, a silicon wafer.

Construction 202 comprises a body region 208 which can correspond to, for example, one of the active regions described previously with reference to FIG. 7 (with the active regions being shown as regions 42, 44 and 46 in FIG. 7). Accordingly, the entirety of the portion of body region 208 extending into material 26 can preferably be within a single crystal of material 26. Such can be accomplished by having an entirety of material 26 be monocrystalline, or by having material 26 be polycrystalline with very large crystals, in accordance with aspects discussed previously in this disclosure. Additionally, an entirety of the body region within strained lattice material 40 is preferably within a single crystal of the strained lattice material. Such can be accomplished by having the entirety of the strained lattice material be monocrystalline, or by having strained lattice material 40 be polycrystalline with very large crystals.

Body region 208 includes source/drain regions 204 and 206 which extend into the body region, and also includes a channel region 226 extending between the source/drain regions. Regions 204 and 206 can be referred to as first and second diffusion regions, respectively, in the discussion that follows. Alternatively, regions 204 and 206 can be referred to as drain and source regions, respectively, in the discussion that follows. It is noted that source/drain regions of FIG. 10 are similar to the source/drain regions 58 of FIG. 8, and are conductively-doped as were the source/drain regions of FIG. 8. However, the source/drain regions of FIG. 10 are not shown with cross-hatching. None of the conductive materials of FIG. 10, or the figures following FIG. 10, are shown with cross-hatching in an effort to simplify the drawings. The discussion herein will, however, identify the materials of FIG. 10 and the following drawings which are electrically conductive.

In the shown aspect of the invention, source/drain regions 204 and 206 are n-type doped regions, and channel region 226 is a p-type doped region. It is to be understood, however, that the invention encompasses other embodiments in which the source/drain regions are p-type doped regions and the channel region is an n-type doped region. In either event, source/drain regions of one conductivity type extend into the body, and the body further comprises a region oppositely doped to the conductivity-type of the source/drain regions, with such oppositely-doped region including a channel region extending between the source/drain regions.

A gate insulator stack 224 is over channel region 226, and a gate 210 is over the insulator stack 224. A silicide 236, such as cobalt or nickel silicide, is shown formed over gate 210. In particular aspects, gate 210 comprises conductively-doped polycrystalline silicon, and the silicide is formed physically against the polycrystalline silicon of the gate.

Spacers 228 are formed along sidewalls of a stack comprising gate insulator 224, gate 210 and silicide 236. Spacers 228 can comprise a suitable insulative material, such as, for example, silicon dioxide and/or silicon nitride. In particular-aspects, the spacers comprise oxide-nitride-oxide (ONO) constructions.

In the shown construction, gate insulator stack 224 includes a first tunnel barrier layer 230 formed over channel region 226, a metal suicide layer 232 formed over tunnel barrier layer 230, and a second tunnel barrier layer 234 formed over layer 232. Tunnel barrier layers 230 and 234 can have the same composition as one another, and in the shown embodiment merge as a single structure. Metal silicide layer 232 functions as a floating plate formed over the tunnel barrier layer 230, and in the shown construction extends over second diffusion region 206 to electrically contact diffusion region 206. It is noted that the floating plate contacts only one of the first and second diffusion regions 204 and 206.

Although layer 232 is described as comprising a metal silicide, it is to be understood that layer 232 can comprise any suitably electrically conductive material. In particular aspects, layer 232 can comprise a silicide of a transition metal (and accordingly can be referred to as a transition metal silicide).

Various exemplary thickness and compositions of particular layers utilized in construction 202 are as follows. First tunnel barrier 230 can include, for example, a 3 nanometer to 5 nanometer thick layer of silicon dioxide; second tunnel barrier 234 can include a 3 nanometer to 5 nanometer thick layer of silicon dioxide, or alternatively a layer of aluminum oxide ($Al_2O_3$) with an equivalent oxide thickness ($T_{EQ.\ OX}$) of from about 3 nanometers to about 5 nanometers. Tunnel-blocking layers 230 and 234 are typically trap-free high band gap insulators which alleviate, and preferably prevent charge loss to a substrate comprising materials 12, 14, 16, 26 and 40, or to the gate. The tunnel-blocking layers can be other insulators besides, or in addition to $SiO_2$ and $Al_2O_3$, depending on the leakage specification and tolerance of the cell and the operational specifications (such as, Vdd, etc.)

It is noted that a diode (such as diode 164 of FIG. 1A) can hold a charge on floating plate 232 for a time that can be sufficiently long for various applications. However, such diode will typically have a leakage current. In particular aspects of the invention, floating plate 232 can be formed with relatively shallow traps to hold the charge. In embodiments such as those illustrated below in FIG. 11, the charge trapping centers can be created by interfacing conducting metal silicides with appropriate metal oxides (in particular embodiments, the metal oxides can be oxides of transition metals, and referred to as transition metal oxides) to achieve desired charge trapping and retention characteristics. More specifically, FIG. 11 illustrates an NVRAM transistor identical to that described above with reference to FIG. 10 in most respects, but comprising a modified gate insulator stack 224.

Figure 11:
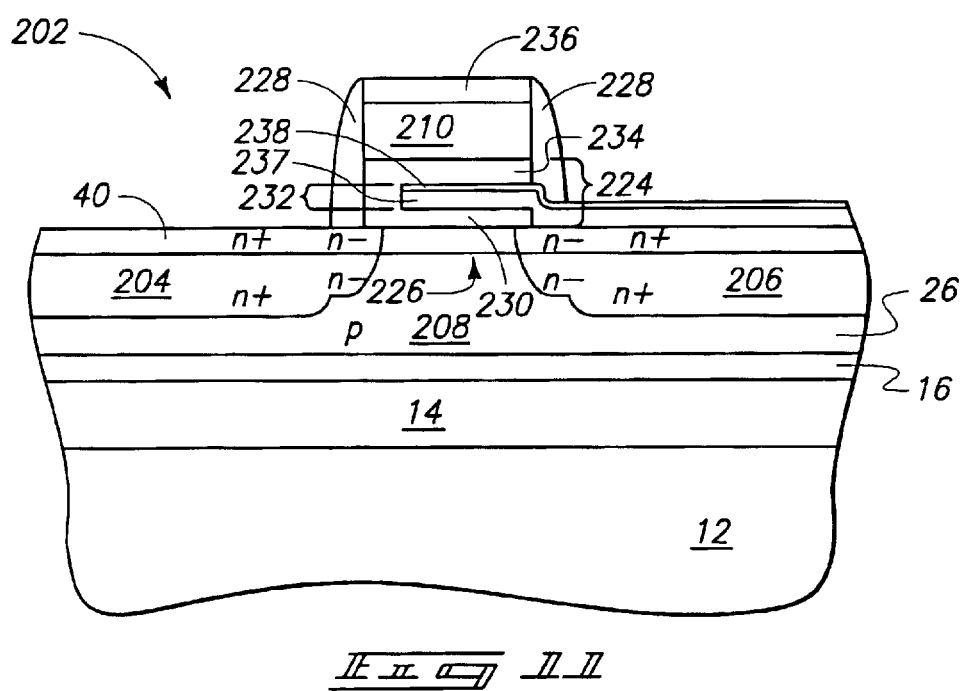
FIG. 11 illustrates a diagrammatic, cross-sectional view of another exemplary NVRAM device according to an aspect of the present invention.

The stack 224 of FIG. 11 includes compatible combinations of one or more metal suicides 237 and one or more metal oxides 238 in place of the metal silicide 232 discussed above with reference to FIG. 10. In other words, the floating plate of FIG. 11 comprises a combination of compatible metal suicides 237 and metal oxides 238.

Layers 237 and 238 can be referred to as floating plate charge center layers. Layer 237 can comprise a transition metal silicide, and will typically be from about 10 nanometers to about 30 nanometers thick. Layer 238 will typically comprise a transition metal oxide, and will typically be from about 1 nanometer to about 2 nanometers thick. The transition metal oxide (or oxides) can be deposited utilizing, for example, atomic layer deposition:(ALD) techniques. Among the materials that can be utilized for layers 237 and 238 are combinations of $ZiSi_2$—$ZrO_2$; $TiSi_2$—$TiO_2$; and $HfSi_2$—$HfO_2$. However, it is to be understood that the invention is not limited to any particular combination, and other combinations besides those specifically disclosed are viable for meeting desired diode characteristics of the metal silicide and band gap characteristics of the metal oxide. Typically, transition metal silicides have relatively low Schottky barrier heights, have large forward current, and have relatively low reverse leakage characteristics. Also, transition metal oxides typically have approximately 3 ev to 5 ev of band gap, with nearly 1 ev of electron barrier height from the silicide to the dielectric conduction band. Such can provide a good balance of charge retention, as well as ease of charge transport to and from charge centers of the transition metal oxides.

The constructions of FIGS. 10 and 11 can be considered to be thin film device constructions, particularly in aspects in which the total thickness of the layers utilized in the body is less than or equal to 2,000 angstroms. In particular aspects, the constructions of FIGS. 10 and 11 can be considered to be thin film transistor (TFT) constructions.

It is noted that although the term "body" is utilized above to describe the entire active region of an NVRAM device, the term can also be utilized herein to refer specifically to only the portion of the NVRAM device that is oppositely doped to the source/drain regions. In other words, the term "body" can be utilized to refer to a portion of the active region which excludes the source/drain regions. For purposes of interpreting this disclosure and the claims that follow, the term "body" is to be understood to include the source/drain regions except when it is explicitly stated otherwise.

FIG. 12 is a fragmentary top view of an NVRAM array illustrating formation of four adjacent NVRAM cells having NFET transistors, and further illustrating bitline and wordline representations superimposed on the array, in accordance with an aspect of the present invention. Active regions 340 and 342 for the switching transistors are defined in a suitable substrate (with the term "substrate" being utilized to refer generally to an appropriate semiconductor material, such as, for example, the materials 26 and 40 of FIGS. 10 and 11, rather than referring to the base material 12). Four transistors 302A, 302B, 302C and 302D are formed in defined locations of the illustrated active regions 340 and 342.

NFET transistors are formed on a p-type substrate or well region. A gate insulator stack and a gate are formed at 344A for transistor 302A, at 344B for transistor 302B, at 344C for transistor 302C, and at 344D for transistor 302D. During fabrication of the gate insulator stacks, a metal silicide is formed to contact the substrate at 346 for transistors 302A and 302B, and at 348 the transistors 302C and 302D. After the gates are defined, the substrate is heavily doped with n-type impurities to form a first n+ diffusion region (or drain region) at 304A for transistor 302A, at 304B for transistor 302B, at 304C for transistor 302C, and at 304D for transistor 302D, and to form a second n+diffusion region (or source or floating node region) at 306A for transistor 302A, at 306B for transistor 302B, at 306C for transistor 302C, and at 306D for transistor 302D. A special n+doping mask is used such that appropriate regions of areas 350 and 352 (along with the substrate areas under the defined gate areas 344A, 344B, 344C, and 344D) can remain p-type doped.

Bitline contacts are shown at 354A, 354B, 354C, and 354D for the bitlines (BL). Wordlines (WL) contact the gates. The metal-silicide contacts the p-type substrate, and thus forms Schottky diodes at 350 and 352. Lateral semiconductor junction diodes are formed at the p-n+junctions at 356 and 358. In the illustrated array, adjacent memory cells share Schottky diodes and lateral junction diodes, and thus space can be saved. One of ordinary skill in the art will understand that bitline contacts can also be shared by adjacent memory cells.

Figure 14:
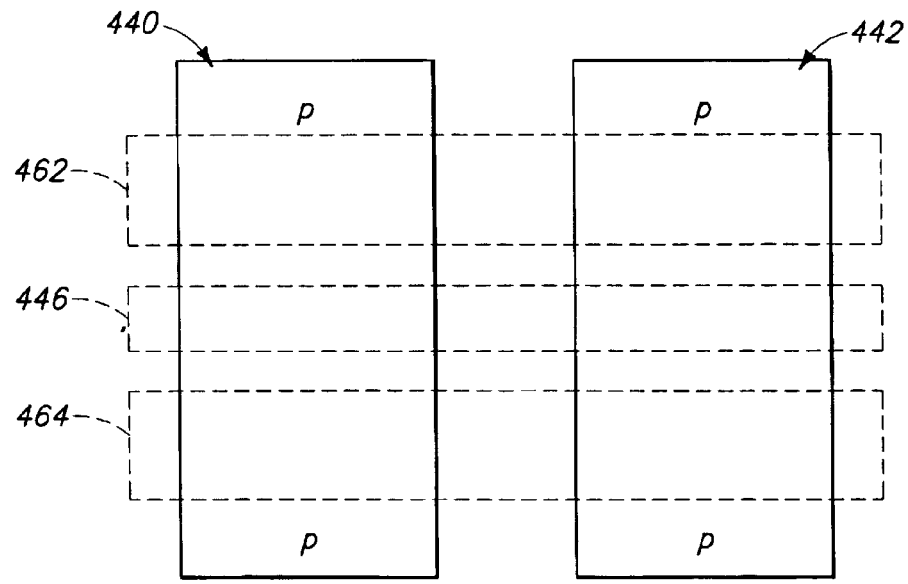
Figure 15:
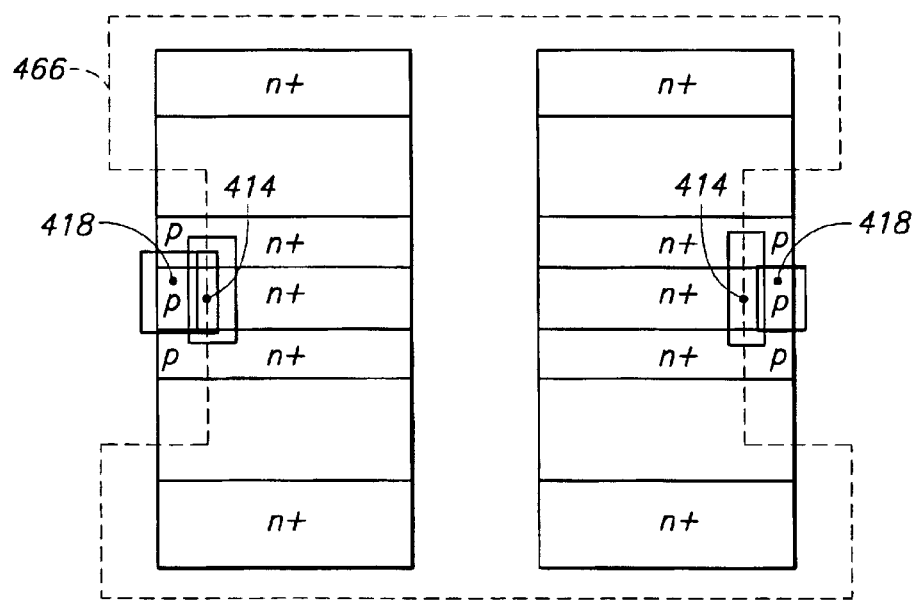

FIGS. 13–15 illustrate exemplary processes for fabricating the NVRAM array of FIG. 12. Referring to FIG. 13, transistor active regions 440 and 442 are defined in a p-type substrate (the substrate can comprise, for example, a p-type doped strained lattice layer 40 and a p-type doped relaxed lattice layer 26). A first layer of tunnel oxide (for example, silicon dioxide) is deposited over the active regions 440 and 442. The first tunnel oxide layer is selectively removed at 446 for a desired storage node and Schottky region. One of ordinary skill in the art can understand that the Schottky diode and lateral junction diode can be formed at the desired storage node region 446. A layer of metal silicide (such as, for example, transition metal silicide) is deposited using mask 460. The metal silicide contacts the substrate at 446, and extends into the gate insulator stack region. An appropriate tolerance margin can be utilized to prevent the metal silicide from extending beyond the gate insulator stack region into the area where the first diffusion region will be formed. A layer of metal oxide, such as, for example, transition metal oxide, is deposited on the layer of metal silicide. The metal oxide functions as shallow charge traps to hold charge in the gate insulator stack. A second layer of tunnel barrier oxide is formed on the metal oxide layer. A polysilicon layer is formed on the second layer of tunnel oxide, and a polysilicon gate is defined within the polysilicon layer, as represented by 462 and 464 in FIG. 14. FIG. 14 also illustrates the area 446 where the metal silicide layer contacts the substrate.

FIG. 15 illustrates the outline of the block mask 466 defining the asymmetric n+ diffusion at the source side of the device. Block mask 466 defines the built-in Schottky diode, generally represented at region 418, and also defines the built-in lateral n+–p diode, generally represented at region 414. Both the polysilicon gate and diffusion channel regions are silicide after the gate definition and n+ source/drain implant. The over-layer of the second silicide can overlap the buried silicide, and can also contact the gate insulator stack.

Figure 16:
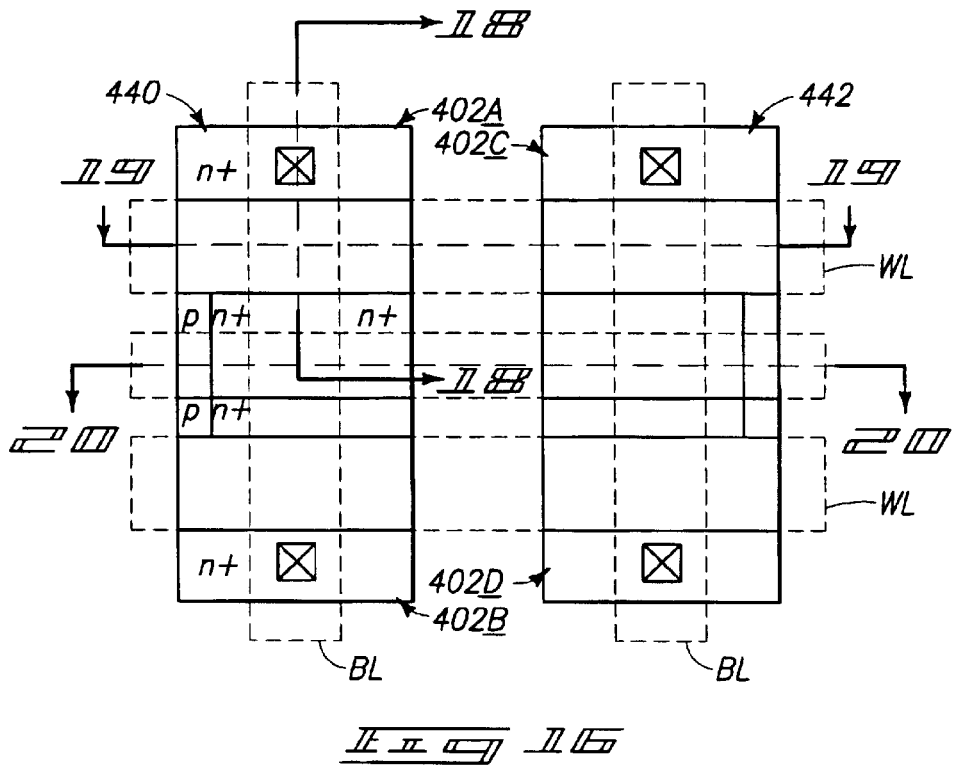

FIG. 16 illustrates a top view of the fabricated memory array. Such top view serves as a point of reference for the circuit schematic and cross-sectional views of FIGS. 17–21. The NVRAM of the present invention can be formed using standard silicon gate FET device processes, along with the following exemplary alterations. One of the alterations relates to forming the metal-silicide layer to form a Schottky body contact which provides the built-in Schottky diode. The first layer of gate oxide (for example, silicon dioxide) is first grown over the channel active region in a conventional way, and a body contact mask removes the oxide over the selected "source" region of the p-type doped substrate for the Schottky metal-silicide layer (for example, $ZrSi_2$). The $ZrSi_2$ layer can be formed or deposited. A metal oxide (for example, $ZrO_2$) is formed using, for example, an ALD process. The metal oxide is selectively defined to provide appropriate overlap into the FET gate region. Such definition of the metal oxide and underlayer $ZrSi_2$ plate can be accomplished utilizing a second mask. A layer of stoichiometric $SiO_2$ or $Al_2O_3$ is then deposited.: The polysilicon gate is deposited and defined. A unique block mask can define the source/drain n+implant region, while also allowing implanting of the polysilicon gate. Subsequently, all processing steps can be those of standard CMOS or SOI-CMOS FET technology including those used for nickel silicide and/or cobalt silicide for forming a second silicide layer in the gate and channel regions. The second silicide layer can overlap the first silicide layer in selected regions of the channel.

Figure 17:
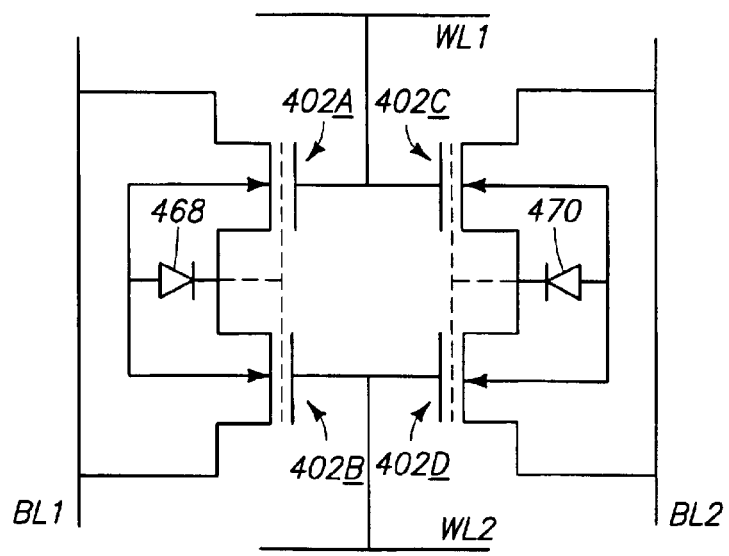
FIG. 17 is a schematic illustration of the NVRAM array illustrated in FIGS. 12 and 16 according to an exemplary aspect of the invention.

FIG. 17 is a circuit schematic illustration of the NVRAM array illustrated in FIGS. 12 and 16, in accordance with various aspects of the invention. The schematic of FIG. 17 shows both diode 468 and diode 470 as a combination of a Schottky diode and a lateral p–n+ junction diode, such as is generally illustrated in FIG. 1C. A person of ordinary skill in the art will understand that transistors 402A and 402B share Schottky and lateral junction diodes represented by 468; and that transistors 402C and 402D share Schottky and lateral junction diodes represented by 470.

Figure 18:
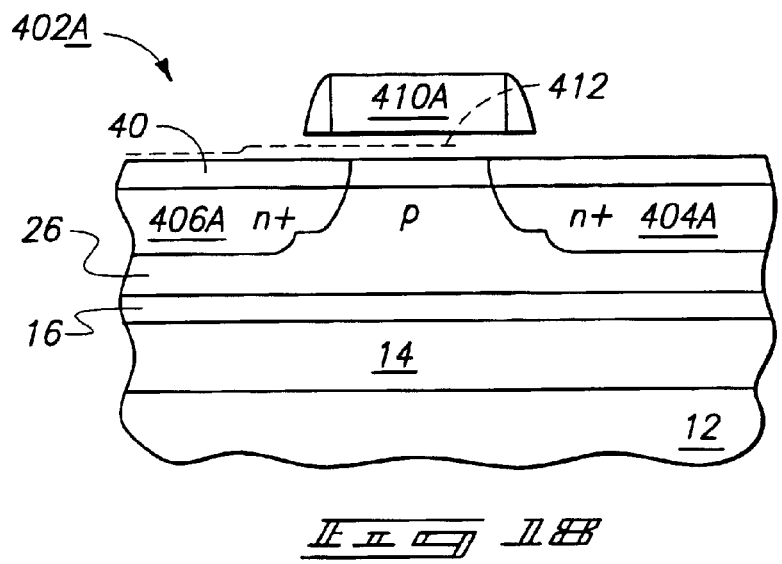
FIG. 18 illustrates a cross-sectional view taken along the line 18—18 of FIG. 16.

FIG. 18 illustrates a cross-sectional view taken along line 18—18 of FIG. 16. The shown transistor 402A includes a first diffusion region (or drain region) 404A and a second diffusion region (or source region) 406A formed in a substrate. A transistor gate 410A is separated from the substrate by a gate insulator stack. The illustrated gate insulator stack includes a floating plate 412, which includes a layer of metal silicide as represented by the dotted line. The floating plate is sandwiched between a first tunnel oxide and a second tunnel oxide in the gate insulator stack (the first and second tunnel oxide layers are not specifically shown in the figure, but are implied by spaces above and below the floating plate). A window is formed in the first tunnel oxide such that, when the metal silicide layer 412 is deposited, it contacts the second diffusion region 406A. The dashed line representing the metal silicide is spaced from an upper surface of the diffusion region in the illustration since the dashed line would not be visible if it were superimposed on the upper surface. However it is to be understood that the metal silicide can actually physically contact the upper surface of the diffusion region.

The interface between the metal silicide layer and the second diffusion region provides the Schottky diode. Schottky barrier heights for metal or metal silicide-silicon (p-type or n-type) are capable of being varied by selecting an appropriate metal or metal-silicide to be a low barrier Schottky or a high barrier Schottky. The Schottky diode is a majority carrier device, and thus can have a very fast time constant. Additionally, the Schottky diode can be fabricated to have a very low reverse leakage (such as, for example, a leakage much less than $1 \times 10^{-8}$ A/cm$^2$), while conducting a large forward current at a negligible voltage drop.

Figure 19:
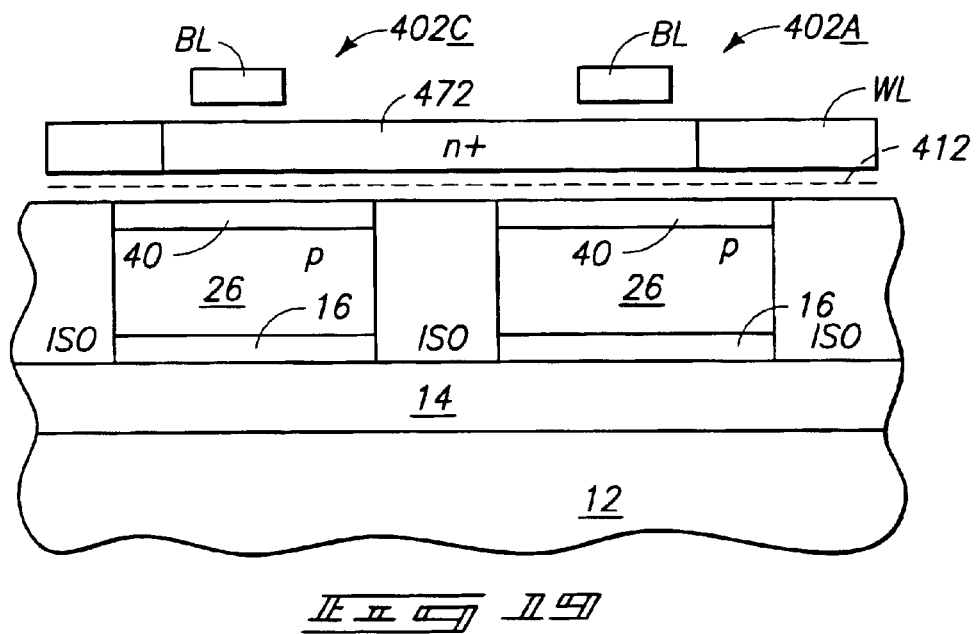
FIG. 19 illustrates a cross-sectional view taken along the line 19—19 of FIG. 16.

FIG. 19 illustrates a cross-sectional view taken along line 19—19 of FIG. 16. The transistor active regions 440 and 442 (FIG. 16) formed in the p-type substrate are separated by isolation regions (ISO). A first tunnel oxide layer is formed above the p-type substrate, a floating plate (including a metal silicide layer 412) is formed above the first tunnel oxide layer, and a second tunnel oxide layer is formed above the floating plate. The wordline (WL) includes an n+ doped polysilicon region 472, which is self-aligned to the n+ source/drain diffusion region. Bitlines (BL) are formed above the wordline (WL), as shown.

Figure 20:
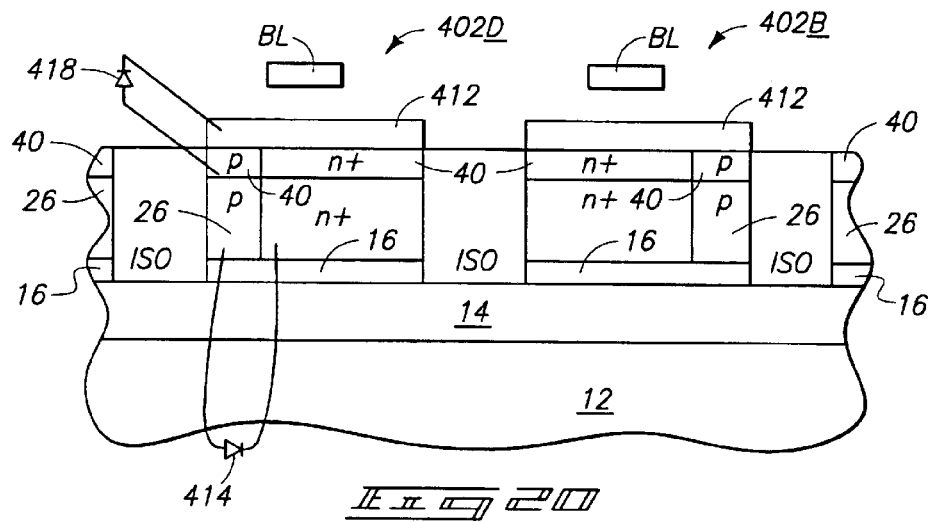
FIG. 20 illustrates a cross-sectional view taken along the line 20—20 of FIG. 16.

FIG. 20 illustrates a cross-sectional view taken along the line 20—20 of FIG. 16. The transistor active regions 440 and 442 (FIG. 16) formed in the p-type substrate are separated by the isolation regions. The asymmetric n+ source/drain mask provides the illustrated doping profile in which both the p substrate and an n+ diffusion region share a top surface of the transistor active region. The first tunnel oxide is selectively removed from the top surface at a source (or storage node) region of the cell so that the metal silicide 412 directly contacts both the p substrate and the n+ second diffusion region (or source). A lateral semiconductor junction diode is formed by the p–n+ junction as illustrated by diode 414. The interface between the n+ diffusion region and the metal silicide forms an ohmic contact. A Schottky diode is formed by the interface between the p substrate and the metal silicide as illustrated by diode 418. Bitlines are formed above the transistor active regions, as shown.

Figure 21:
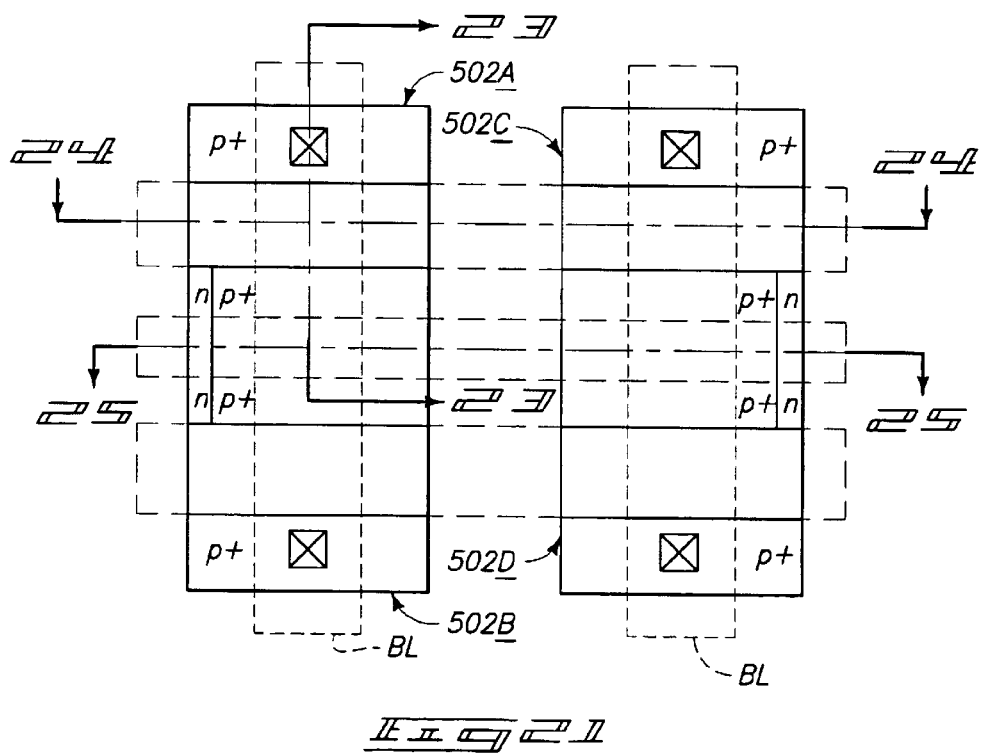
FIG. 21 illustrates a fragmentary top view of an exemplary NVRAM array showing four adjacent NVRAM cells having PFET transistors, in accordance with an exemplary aspect of the present invention.

FIG. 21 illustrates a fragmentary top view of an NVRAM array illustrating formation of four adjacent NVRAM cells having PFET transistors, in accordance with exemplary aspects of the present invention. Cell charge polarities are reversed in the PFET cells relative to the above-described NFET cells. PFET cells are inherently slower than NFET cells because holes are typically less mobile than electrons. Thus, the NFET cell can have advantages over the PFET cell. However, basic concepts of the invention can be valid for both PFET and NFET cells, and one of ordinary skill in the art will understand that both NFET and PFET cell embodiments are encompassed by the present invention.

Figure 22:
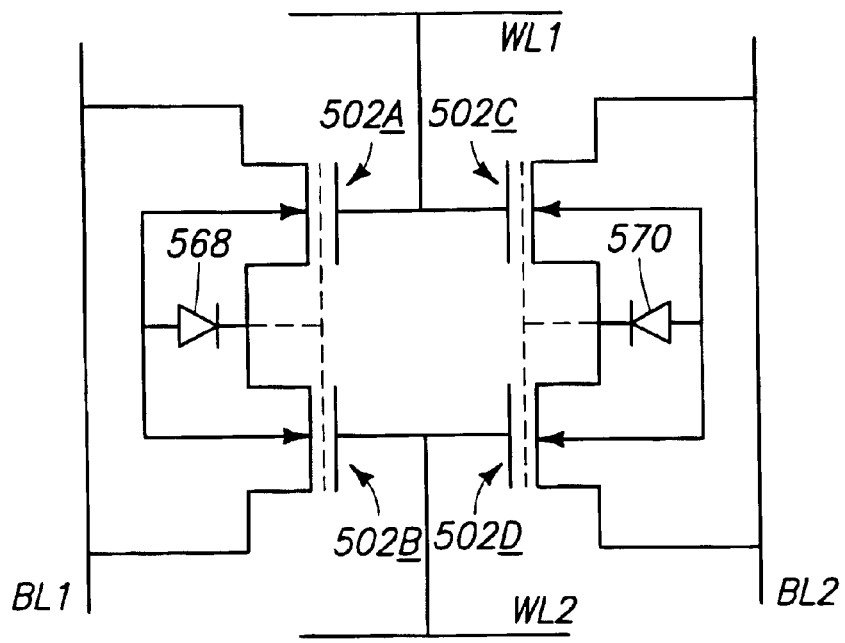
FIG. 22 is a schematic illustration of the NVRAM array of FIG. 21.

FIG. 22 is a circuit schematic illustration of the NVRAM array of FIG. 21 according to exemplary embodiments of an aspect of the invention. In the illustrated schematic, both diode 568 and diode 570 represent a combination of a Schottky diode and a lateral p+–n junction diode. One of ordinary skill in the art will understand that adjacent transistors 502A and 502B share Schottky and lateral junction diodes represented by diode 568, and that adjacent transistors 502C and 502D share Schottky and lateral junction diodes represented by diode 570.

Figure 23:
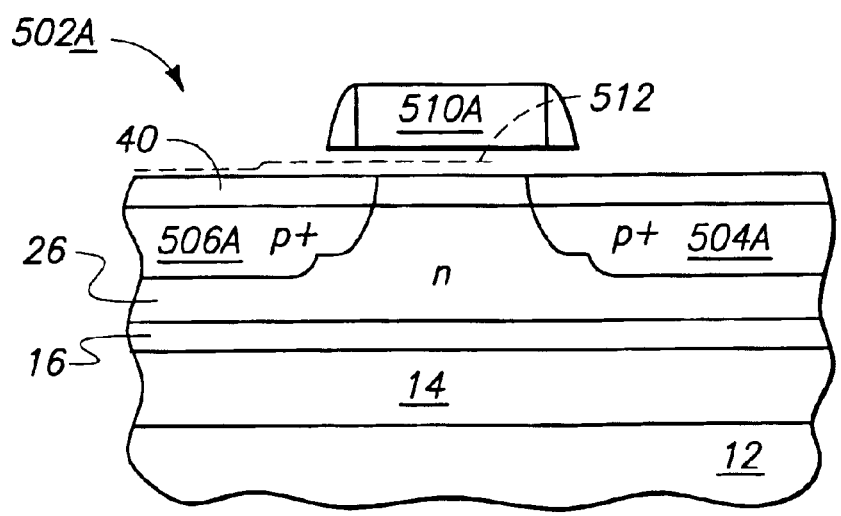
FIG. 23 illustrates a cross-sectional view taken along the line 23—23 of FIG. 21.

FIG. 23 illustrates a cross-sectional view taken along the line 23—23 of FIG. 21. Transistor 502A includes a first diffusion region (or drain region) 504A, and a second diffusion region (or source region) 506A extending through layer 40 and into layer 26. A transistor gate 510A is separated from the substrate by a gate insulator stack. The illustrated gate insulator stack includes a floating plate 512, which comprises of metal silicide (as represented by the dotted line). Floating plate 512 is sandwiched between a first tunnel oxide and a second tunnel oxide in the gate insulator stack; with the first and second tunnel oxides being represented by spaces above and below the floating plate 512 in the gate stack. A window is formed in the first tunnel oxide such that the metal suicide layer contacts the second diffusion region when the metal suicide is deposited. The contact between the metal silicide layer and the diffusion region can be both electrical contact and physical contact. The interface between the metal silicide layer and the second diffusion region provides the Schottky diode.

FIG. 24 illustrates a cross-sectional view along the line 24—24 of FIG. 21. The transistor active regions are formed in an n-type substrate, and are separated by isolation regions (ISO). A first tunnel oxide is formed above the n-type substrate (the first tunnel oxide is indicated by a gap between the floating plate and the layer 40), a floating plate (including a metal silicide layer 512) is formed above the first tunnel oxide layer, and a second tunnel oxide layer is formed above the floating plate (the second tunnel oxide is indicated by a gap over the floating plate). The wordline includes a p+ doped polysilicon region 572, which is self-aligned to the p+ source/drain. Bitlines are formed above the wordline in the shown aspect of the invention.

FIG. 25 illustrates a cross-sectional view along the line 25—25 of FIG. 21. The transistor active regions are formed in the n-type substrate, and are separated by the isolation regions. The asymmetric p+ source/drain mask provides the illustrated doping profile in which both the n substrate and a p+ diffusion region share a top surface of the transistor active regions. The first tunnel oxide is selectively removed from the top surface the source (or storage node) region of the cell so that the metal silicide layer 512 directly contacts both the n substrate and the p+ second diffusion region (or storage). A lateral semiconductor junction diode is formed by the p+–n junction as illustrated by diode 514/ The interface between the n+ diffusion region and the metal suicide forms an ohmic contact. A Schottky diode is formed by the interface between the metal silicide and the n-type doped region of the substrate as illustrated by diode 518. Bitines are formed above the transistor active regions, as shown.

Table 1 illustrates cell operations in various embodiments for an NFET NVRAM for which Vdd is approximately equal to 2.5 volts.

TABLE 1

| Operation | Node Potentials: | | | Storage | Remark |
|---|---|---|---|---|---|
| | BitLine | WordLine | Substrate | Node (S) | |
| Write 1 (High) | +5 V | 2.5 V | 0 V | Float | Reverse biased diode. Floating plate of the addressed bit is charged: $V_T$ Change: $V_T(0) \rightarrow V_T(1) = 2.5$ V |
| Write 0 (Low) | 0 V | 0 V | 2.5 V | Float | Forward biased diode. Current (holes) neutralize charges of the addressed Bit: $V_T$ Change: $V_T(1) \rightarrow V_T(0) = 1.0$ V |
| Half-select cells | 0 V | 2.5 V | 0 V | Float | No change in state. |
| Read 1 | Float | 2.5 V | 0 V | Float (1) | Device Off: No change in Bitline potential |
| Read 0 | Float | 2.5 V | 0 V | Float (0) | Device On: Change in Bit-line potential sensed. |

One of ordinary skill in the art will understand that NVRAM designs can be fabricated utilizing cell operations in addition to, or other than, those described in Table 1.

FIGS. 10–25 show various different dopant levels, and utilize the designations p+, p, p–, n–, n and n+ to distinguish the levels. The difference in dopant concentration between the regions identified as being p+, p, and p– are typically as follows. A p+ region has a dopant concentration of at least about $10^{20}$ atoms/cm$^3$, a p region has a dopant concentration of from about $10^{14}$ to about $10^{18}$ atoms/cm$^3$, and a p– region has a dopant concentration on the order of or less than $10^{16}$ atoms/cm$^3$. It is noted that regions identified as being n–, n and n+ will have dopant concentrations similar to those described above relative to the p–, p and p+ regions respectively, except, of course, the n regions will have an opposite-type conductivity enhancing dopant therein than do the p regions.

The p+, p, and p– dopant levels are shown in the drawings only to illustrate differences in dopant concentration. It is noted that the term "p" is utilized herein to refer to both a dopant type and a relative dopant concentration. To aid in interpretation of this specification and the claims that follow, the term "p" is to be understood as referring only to dopant type, and not to a relative dopant concentration, except when it is explicitly stated that the term "p" refers to a relative dopant concentration. Accordingly, for purposes of interpreting this disclosure and the claims that follow, it is to be, understood that the term "p-type doped" refers to a dopant type of a region and not a relative dopant level. Thus, a p-type doped region can be doped to any of the p+, p, and p– dopant levels discussed above. Similarly, an n-type doped region can be doped to any of the n+, n, and n– dopant levels discussed above.

Figure 26:
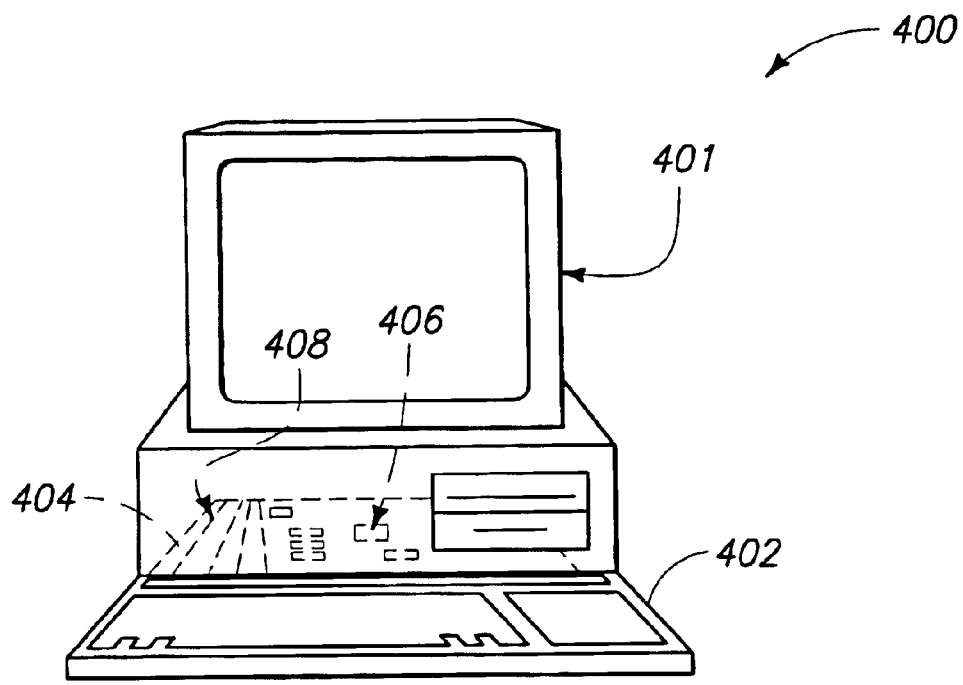
FIG. 26 is a diagrammatic view of a computer illustrating an exemplary application of the present invention.
Figure 27:
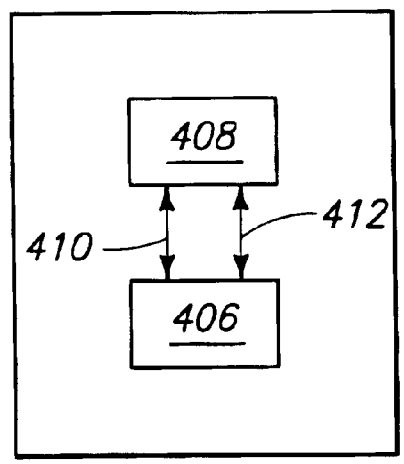
FIG. 27 is a block diagram showing particular features of the motherboard of the FIG. 26 computer.

FIG. 26 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 8 or the NVRAM cells described with reference to FIGS. 10–25. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 27. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 28:
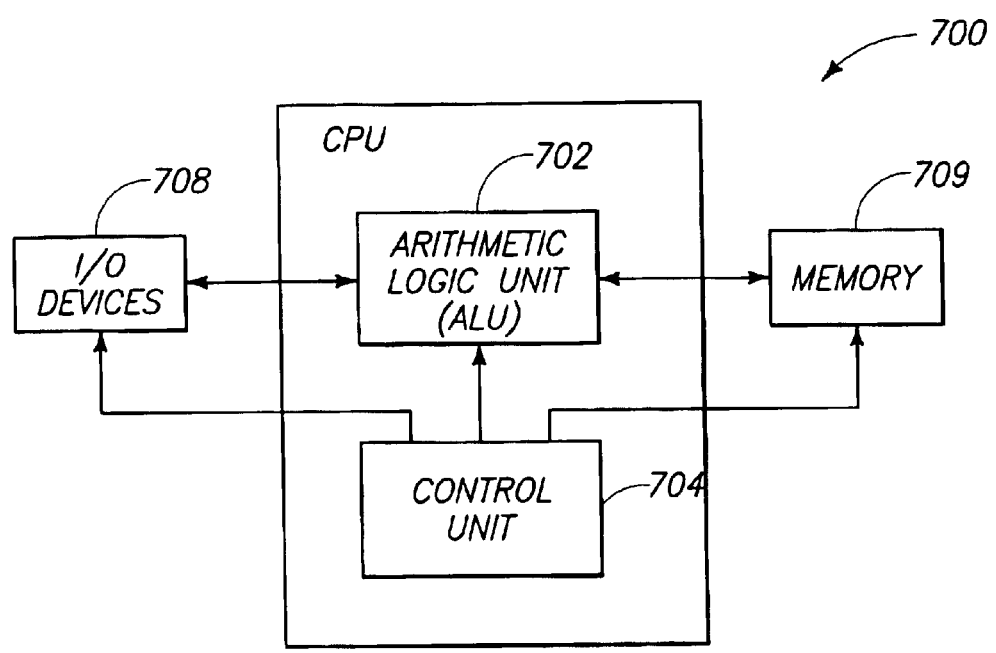
FIG. 28 is a high-level block diagram of an electronic system according to an exemplary aspect of the present invention.

FIG. 28 is a high-level block diagram of an electronic system according to exemplary aspects of the invention. The illustrated system 700 can be a computer system, a process control system, or any other system that employs a processor and associated memory. Electronic system 700 has function elements, including a processor or arithmetic/logic unit (ALU) 702, a control unit 704, a memory device unit 706 and an input/output (IO) device 708. Generally, electronic system 700 will have a native set of instructions that specify operations to be performed on data by the processor 702 and other interactions between the processor 702, the memory device unit 706 and the IO devices 708. Control unit 704 coordinates all operations of the processor 702, the memory device 706 and the IO devices 708 by continuously cycling through a set of operations that cause instructions to be fetched from memory device 706 and executed. According to various aspects of the invention, memory device 706 can include, but is not limited to, random access memory (RAM) devices, read-only memory (ROM) devices, and peripheral devices such as floppy disk drives and compact disk (CD-ROM) drives. Persons of ordinary skill in the art will understand that any of the illustrated electrical components can be fabricated to include NVRAM cells formed in accordance with aspects of the present invention.

The system 700 of FIG. 28 is utilized to provide a general understanding of an exemplary application for structure and circuitry of the present invention, but is not intended to be a complete description of all elements and features of an electronic system utilizing NVRAM cells in accordance with aspects of the present invention. Persons of ordinary skill in the art will understand that the electronic system can be fabricated in single-package processing units, or even on a single semiconductor chip, in order to reduce communication time between the processor and the memory device. Applications containing NVRAM cells can include electronic systems for use in memory modules, device drivers, power modules, communication modems, processor modules, and application-specific modules, and may include multilayer-multichip modules. Appropriate circuitry can further be a subcomponent of a variety of electronic systems, such as a clock, a television, a cell phone, a personal computer, an automobile, an industrial control system, an aircraft, and others.

Figure 29:
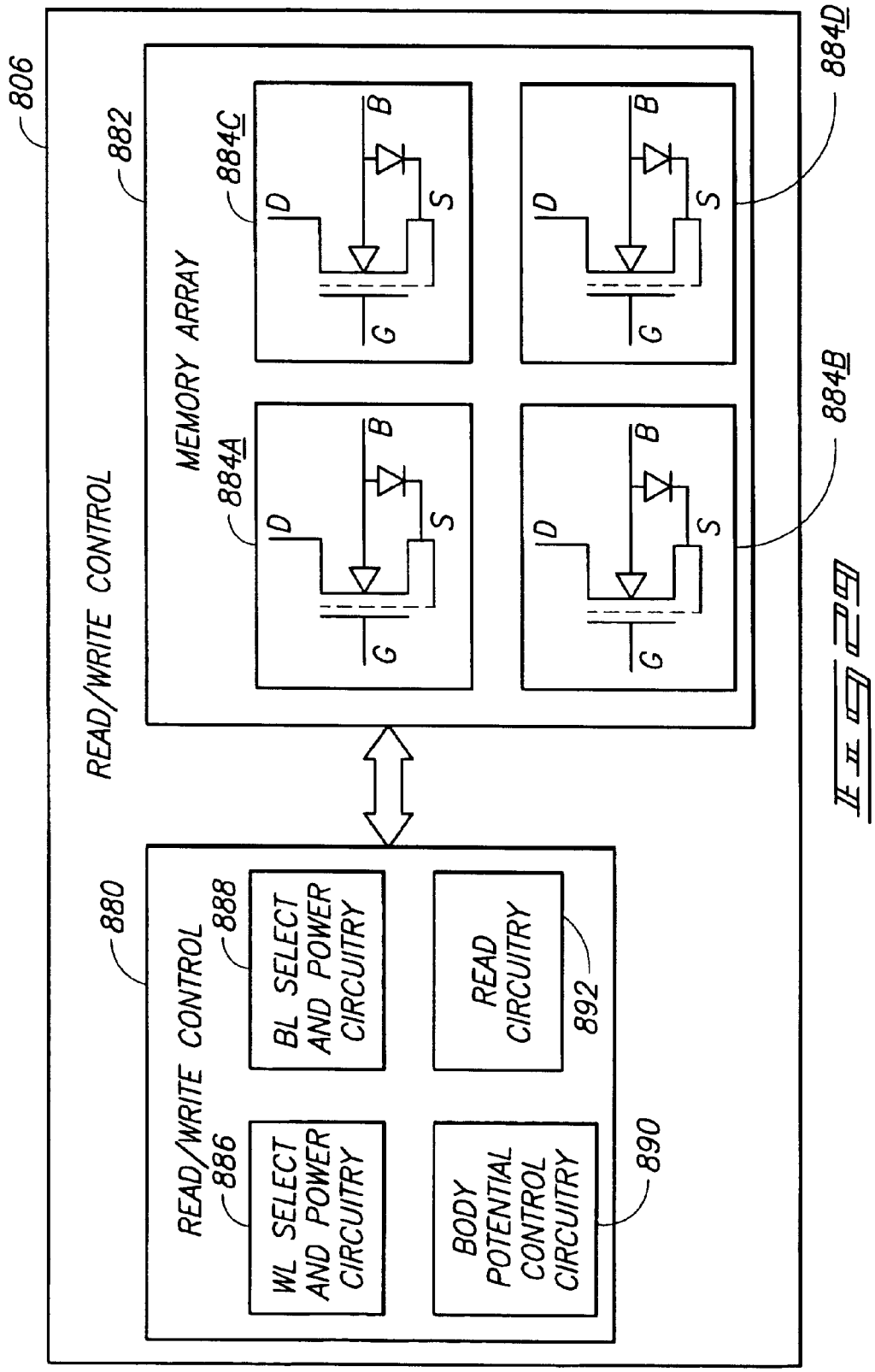
FIG. 29 is a simplified block diagram of an exemplary memory device according to an aspect of the present invention.

FIG. 29 is a simplified block diagram of a memory device according to exemplary aspects of the present invention. The illustrated memory device 806 includes read/write control circuitry 880 to communicate with a memory array 882 of NVRAM cells 884 A–D. The read/write control circuitry 880 includes a wordline select and power circuitry 886 to provide a pulse on a selected wordline. The read/write control circuitry 880 includes a bitline select and power circuitry 888 to provide a pulse on a selected bitline. The read/write control circuitry 880 includes body potential control circuitry 890. Persons of ordinary skill in the art will understand that the body control circuitry can, in particular aspects of the invention, include selection circuitry to provide a pulse to a selected well. The read/write control circuitry 880 can include read circuitry 892 to sense the state of the cell by detecting potential changes on the bitlines. In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A memory device comprising:
   a crystalline layer separated from a substrate by an insulative material; the crystalline layer being less than or equal to about 2000 Å thick and comprising a material which includes silicon and germanium;
   a gate proximate the crystalline layer;
   a pair of source/drain regions proximate the gate and extending into the crystalline layer; accordingly, at least a portion of the source/drain regions being within the crystalline layer; the portion of the source/drain regions within the crystalline layer being contained within a single crystal of the material which includes silicon and germanium;
   a channel region extending between the source/drain regions, the channel region being part of a portion of the memory device that is oppositely doped relative to the source/drain regions;
   a gate insulator stack between the channel region and the gate, the gate insulator stack including a floating plate which is electrically connected to one of the source/drain regions; and
   a diode electrically connecting said one of the source/drain regions to the portion of the memory device that is oppositely doped relative to the source/drain regions.

2. The memory device of claim 1 wherein the material which includes silicon and germanium comprises from about 10 to about 60 atomic percent germanium.

3. The memory device of claim 1 wherein the crystalline layer is polycrystalline.

4. The memory device of claim 1 wherein the crystalline layer is monocrystalline.

5. The memory device of claim 1 wherein the crystalline layer has a relaxed crystalline lattice, and further comprising a strained crystalline lattice layer between the relaxed crystalline lattice and the transistor gate.

6. The memory device of claim 5 wherein the strained crystalline lattice includes silicon.

7. The memory device of claim 5 wherein the strained crystalline lattice includes silicon and germanium.

8. The memory device of claim 1 wherein the gate insulator stack includes:
   a first tunnel oxide region between the floating plate and the channel region; and
   a second tunnel oxide region between the floating plate and the gate.

9. The memory device of claim 1 wherein the source/drain regions are n-type regions.

10. The memory device of claim 1 wherein the source/drain regions are p-regions.

11. The memory device of claim 1 wherein the substrate comprises a semiconductive material.

12. The memory device of claim 1 wherein the substrate comprises glass.

13. The memory device of claim 1 wherein the substrate comprises aluminum oxide.

14. The memory device of claim 1 wherein the substrate comprises silicon dioxide.

15. The memory device of claim 1 wherein the substrate comprises a metal.

16. The memory device of claim 1 wherein the substrate comprises a plastic.

17. A memory cell construction, comprising:
   an electrically insulative material;
   a crystalline layer comprising silicon and germanium over the electrically insulative material;
   a body region extending into the crystalline layer; the entirety of the body region within the crystalline layer being within only a single crystal of the crystalline layer;
   a first diffusion region formed in the body region;
   a second diffusion region formed in the body region and spaced within the body region from the first diffusion region by a channel region;
   a gate insulator stack over the channel region, the gate insulator stack including a floating plate to selectively hold a charge, the floating plate being electrically connected to the second diffusion region;
   a gate over the gate insulator stack; the gate being spaced from the channel region by at least the gate insulator stack; and a diode electrically connecting the body region to the second diffusion region.

18. The construction of claim 17 wherein the gate insulator stack includes:
a first tunnel oxide region between the floating plate and the channel region; and
a second tunnel oxide region between the floating plate and the gate.

19. The construction of claim 18 wherein the floating plate comprises a layer of metal silicide.

20. The construction of claim 18 wherein the floating plate comprises a layer of transition metal silicide.

21. The construction of claim 18 further comprising a layer of metal oxide between the first tunnel oxide region and the second tunnel oxide region.

22. The construction of claim 21 wherein the layer of metal oxide comprises transition metal oxide.

23. The construction of claim 17 wherein:
the body includes a p-type region;
the first and second diffusion regions are n+ regions of the body; and
the diode includes a lateral p–n+ diode between the p-type region of the body and the second diffusion region.

24. The construction of claim 17 wherein:
the body includes an n-type region;
the first and second diffusion regions are p+ regions of the body; and
the diode includes a lateral p+–n diode between the second diffusion region and the n-type region of the body.

25. The construction of claim 17 wherein the floating plate includes a layer of metal silicide.

26. The construction of claim 25 wherein the floating plate further includes a layer of metal oxide.

27. The construction of claim 25 wherein the layer of metal silicide electrically contacts the second diffusion region.

28. The construction of claim 17 further comprising a Schottky diode connecting the body region to the floating plate; the Schottky diode being configured such that the floating plate is discharged through the Schottky diode when the Schottky is forward biased.

29. The construction of claim 28 wherein the Schottky diode includes a layer of metal silicide that electrically contacts the body region.

30. The construction of claim 17 wherein the crystalline layer comprises from about 10 to about 60 atomic percent germanium.

31. The construction of claim 17 wherein the crystalline layer is polycrystalline.

32. The construction of claim 17 wherein the crystalline layer is monocrystalline.

33. The construction of claim 17 wherein the crystalline layer has a relaxed crystalline lattice, and further comprising a strained crystalline lattice layer between the relaxed crystalline lattice and the gate insulator stack.

34. The construction of claim 33 herein the strained crystalline lattice includes silicon.

35. The construction of claim 33 wherein the strained crystalline lattice includes silicon and germanium.

36. The construction of claim 17 wherein the electrically insulative material is supported by a substrate; and wherein the crystalline layer and electrically insulative material are together comprised by an SOI construction.

37. The construction of claim 36 wherein the substrate comprises a semiconductive material.

38. The construction of claim 36 wherein the substrate comprises glass.

39. The construction of claim 36 wherein the substrate comprises aluminum oxide.

40. The construction of claim 36 wherein the substrate comprises silicon dioxide.

41. The construction of claim 36 wherein the substrate comprises a metal.

42. The construction of claim 36 wherein the substrate comprises a plastic.

43. A memory cell construction, comprising;
an electrically insulative material;
a crystalline layer comprising silicon and germanium over the electrically insulative material;
a body region extending into the crystalline layer; the entirety of the body region within the crystalline layer being within only a single crystal of the crystalline layer;
a first diffusion region formed in the body region;
a second diffusion region formed in the body region and spaced within the body region from the first diffusion region by a channel region;
a gate insulator stack over the channel region; the gate insulator stack including a first tunnel oxide region over the channel region, a floating plate on the first tunnel oxide region, and a second tunnel oxide region over the floating plate; the floating plate comprising a metal silicide layer and a metal oxide layer;
a gate over the gate insulator stack; the gate being spaced from the channel region by at least the gate insulator stack;
a lateral semiconductor junction diode electrically connecting the body region to the second diffusion region and being configured such that when the floating plate is charged the junction diode is reverse biased; and
a Schottky diode comprising contact between the metal silicide layer and the body region; the Schottky diode being configured such that the floating plate is discharged when the Schottky diode is forward biased.

44. The construction of claim 43 wherein the crystalline layer comprises from about 10 to about 60 atomic percent germanium.

45. The construction of claim 43 wherein the crystalline layer is polycrystalline.

46. The construction of claim 43 wherein the crystalline layer is monocrystalline.

47. The construction of claim 43 wherein the crystalline layer has a relaxed crystalline lattice, and further comprising a strained crystalline lattice layer between the relaxed crystalline lattice and the gate insulator stack.

48. The construction of claim 47 herein the strained crystalline lattice includes silicon.

49. The construction of claim 47 wherein the strained crystalline lattice includes silicon and germanium.

50. The construction of claim 43 wherein the electrically insulative material is supported by a substrate; and wherein the crystalline layer and electrically insulative material are together comprised by an SOI construction.

51. The construction of claim 50 wherein the substrate comprises a semiconductive material.

52. The construction of claim 50 wherein the substrate comprises glass.

53. The construction of claim 50 wherein the substrate comprises aluminum oxide.

54. The construction of claim 50 wherein the substrate comprises silicon dioxide.

55. The construction of claim 50 wherein the substrate comprises a metal.

56. The construction of claim 50 wherein the substrate comprises a plastic.

57. An electronic system, the electronic system comprising a memory device, the memory device including:

an array of memory cells, at least some of the memory cells including gates supported by a crystalline layer; the crystalline layer being less than or equal to about 2000 Å thick; the crystalline layer comprising a material which includes silicon and germanium; the at least some of the memory cells having body regions within the crystalline layer; each body region within the crystalline layer including only one crystal of said material; the at least some of the memory cells including first and second diffusion regions formed in the body regions; the second diffusion regions being spaced within the body region from the first diffusion regions by channel regions; the at least some of the memory cells including gate insulator stacks over the channel regions, the gate insulator stacks including floating plates, the floating plates being electrically connected to the second diffusion regions; the gates of the at least some of the memory cells being over the gate insulator stacks and being spaced from the channel regions by at least the gate insulator stacks; and the at least some of the memory cells including diodes electrically connecting the body regions to the second diffusion regions;

addressing circuitry coupled to the array of memory cells for accessing individual memory cells in the array of memory cells; and a read circuit coupled to the memory cell array for reading data from memory cells in the array of memory cells.

58. The electronic system of claim 57 wherein the gate insulator stacks include:

first tunnel oxide regions between the floating plates and the channel regions; and second tunnel oxide regions between the floating plates and the gates.

59. The electronic system of claim 58 wherein the floating plates comprise metal silicide.

60. The electronic system of claim 57 wherein the floating plates comprise transition metal silicide.

61. The electronic system of claim 57 wherein:

the body regions include p-type regions;

the first and second diffusion regions are n+ regions of the body regions; and the diodes include lateral p–n+ diodes between the p-type regions of the body regions and the second diffusion regions.

62. The electronic system of claim 57 wherein:

the body regions include n-type regions;

the first and second diffusion regions are p+ regions of the body regions; and the diodes include lateral p+–n diodes between the second diffusion regions and the n-type regions of the body regions.

63. The electronic system of claim 57 wherein the floating plates include metal silicide.

64. The electronic system of claim 63 wherein the floating plates further include metal oxide.

65. The electronic system of claim 57 wherein the crystalline layer is polycrystalline.

66. The electronic system of claim 57 wherein the crystalline layer is monocrystalline.

67. The electronic system of claim 57 wherein the crystalline layer has a relaxed crystalline lattice, and further comprising a strained crystalline lattice layer between the relaxed crystalline lattice and the gates.

68. The electronic system of claim 67 wherein the strained crystalline lattice includes silicon.

69. The electronic system of claim 67 wherein the strained crystalline lattice includes silicon and germanium.

\* \* \* \* \*

UNITED STATES PATENT AND TRADEMARK OFFICE
CERTIFICATE OF CORRECTION

PATENT NO. : 6,768,156 B1
DATED : July 24, 2004
INVENTOR(S) : Arup Bhattacharyya It is certified that error appears in the above-identified patent and that said Letters Patent is hereby corrected as shown below:

Column 6,
Line 23, replace "suicides" with -- silicides --.

Column 10,
Line 58, replace "thenanovoids" with -- the nanovoids --.

Column 12,
Line 23, replace "insulator" with -- Insulator --.

Column 13,
Line 21, replace "material." with -- material --.

Column 15,
Line 60, replace "particular-" with -- particular --.
Line 65, replace "suicide" with -- silicide --.

Column 16 ,
Line 48, replace "suicides" with -- silicides --.
Line 52, replace "suicides" with -- silicides --.

Column 17,
Line 51, replace "n+diffusion" with -- n+ diffusion --.
Line 51, replace "n+doping" with -- n+ doping --.
Line 51, replace "p-n+junctions" with -- p-n+ junctions --.

Column 18,
Line 34, replace "silicide" with -- silicided --.
Line 57, replace "deposited:" with -- deposited --.
Line 59, replace "n+implant" with -- n+ implant --.

Column 19,
Line 62, replace "p—n+ junction" with -- p- n+ junction --.

Column 20,
Line 17, replace "p+—n junction" with -- p+ -n junction --.
Line 30, delete "of"1 after "comprises"
Line 36, replace "suicide" with -- silicide --.
Line 37, replace "suicide" with -- silicide --.
Line 30, insert -- of -- after "surface"
Line 66, replace "p+—n junction" with -- p+ -n junction --.

UNITED STATES PATENT AND TRADEMARK OFFICE
CERTIFICATE OF CORRECTION

PATENT NO. : 6,768,156 B1
DATED : July 24, 2004
INVENTOR(S) : Arup Bhattacharyya It is certified that error appears in the above-identified patent and that said Letters Patent is hereby corrected as shown below:

Column 21,
Line 1, replace "suicide" with -- silicide --.

Column 23,
Line 43, replace "bitlines. In" with -- bitlines. --.
Line 44, insert new paragraph, -- In --.

Column 25,
Line 58, replace "herein" with -- wherein --.

Column 26,
Line 52, replace "herein" with -- wherein --.

Signed and Sealed this

Nineteenth Day of April, 2005

JON W. DUDAS
*Director of the United States Patent and Trademark Office*